United States Patent [19]

Hayashi et al.

[11] Patent Number: 5,113,136

[45] Date of Patent: May 12, 1992

[54] GRADIOMETER APPARATUS WITH COMPENSATION COILS FOR MEASURING MAGNETIC FIELDS

[75] Inventors: Hajime Hayashi, Yamato; Yutaka Igarashi, Yokohama; Takehiko Hayashi, Kawasaki; Takaki Shimura, Machida; Kenji Kawabe, Yokohama, all of Japan

[73] Assignee: Fujitsu Limited, Kawasaki, Japan

[21] Appl. No.: 468,360

[22] Filed: Jan. 22, 1990

[30] Foreign Application Priority Data

Jan. 20, 1989 [JP] Japan ............................ 1-12890
Feb. 14, 1989 [JP] Japan ............................ 1-32824

[51] Int. Cl.⁵ ............... G01R 33/022; G01R 33/025; G01R 33/035
[52] U.S. Cl. ........................... 324/247; 324/225; 324/248
[58] Field of Search ............ 324/244, 47, 248, 260, 324/202, 225

[56] References Cited

U.S. PATENT DOCUMENTS

| | | | |
|---|---|---|---|
| 3,956,690 | 5/1976 | Rorden | 324/248 X |
| 3,965,411 | 6/1976 | Hesterman | 324/248 X |
| 3,976,938 | 8/1976 | Hesterman | 324/248 |

Primary Examiner—Gerard R. Strecker
Attorney, Agent, or Firm—Staas & Halsey

[57] ABSTRACT

An apparatus is provided for measuring a very weak magnetic field generated by a human body, etc. External magnetic noise components coming from other magnetic sources and existing around an object whose magnetic field is to be measured are detected by compensation coils of the apparatus. The compensation coils are oriented in multiple dimensional directions. The detected noise components are weighted and added to each other to correctly find the noise components. Thereafter, the noise components mixed in the objective very weak magnetic field are removed, thereby correctly measuring the very weak magnetic field.

17 Claims, 19 Drawing Sheets

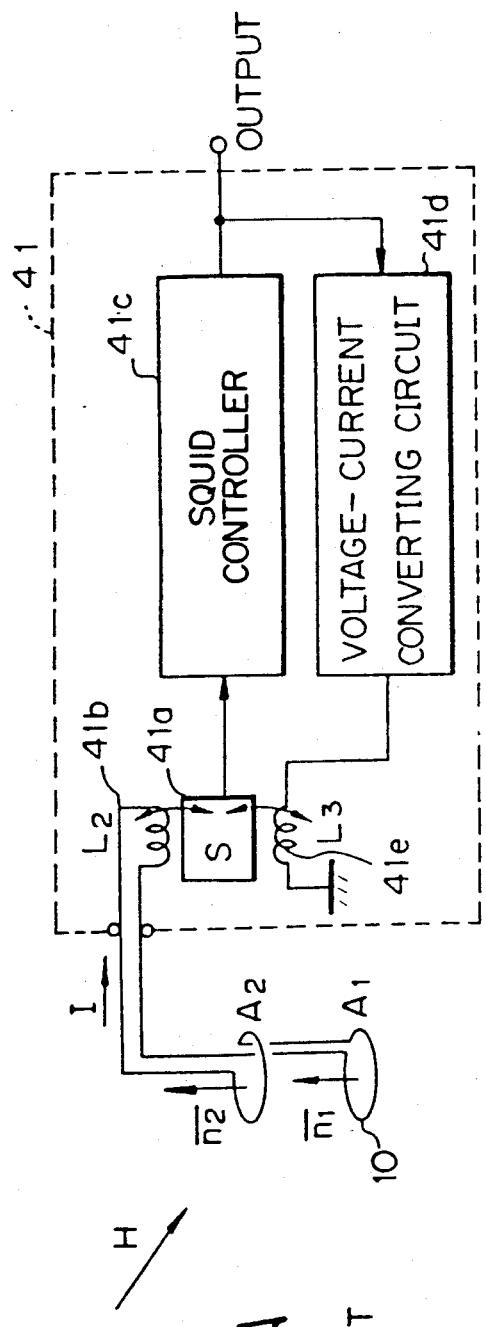
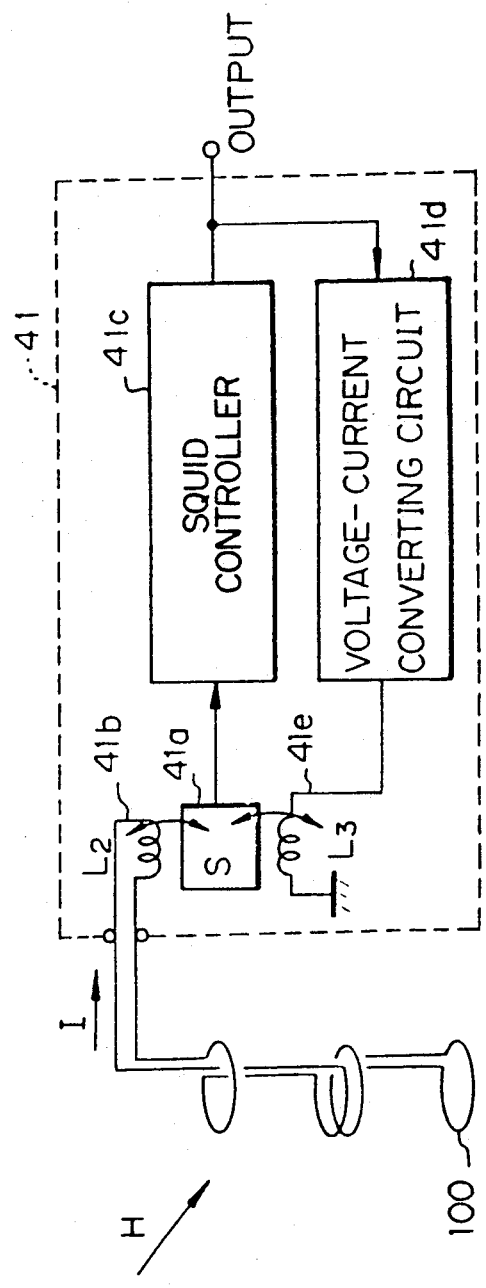
Fig. 1A PRIOR ART
Fig. 1B PRIOR ART

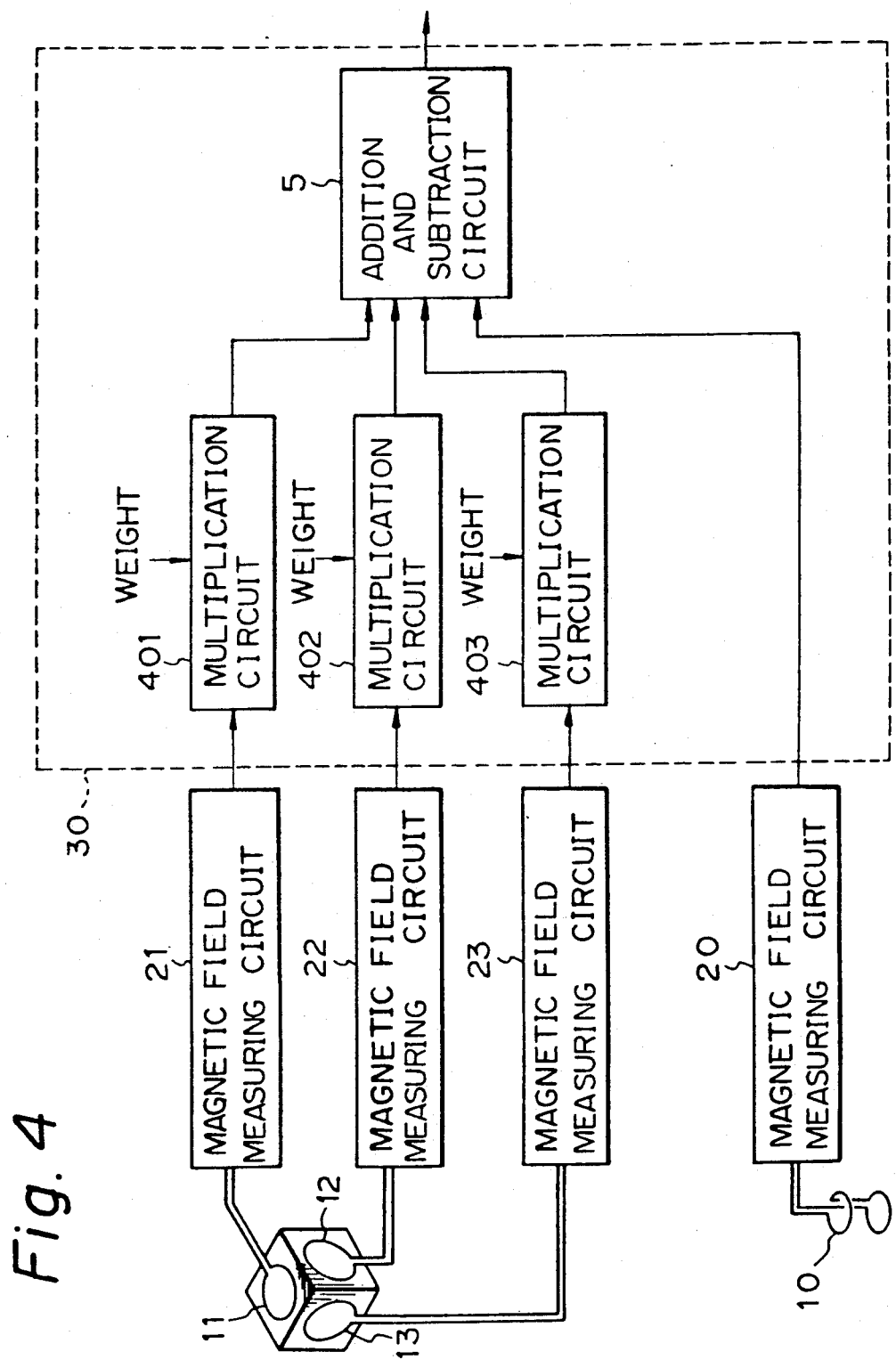

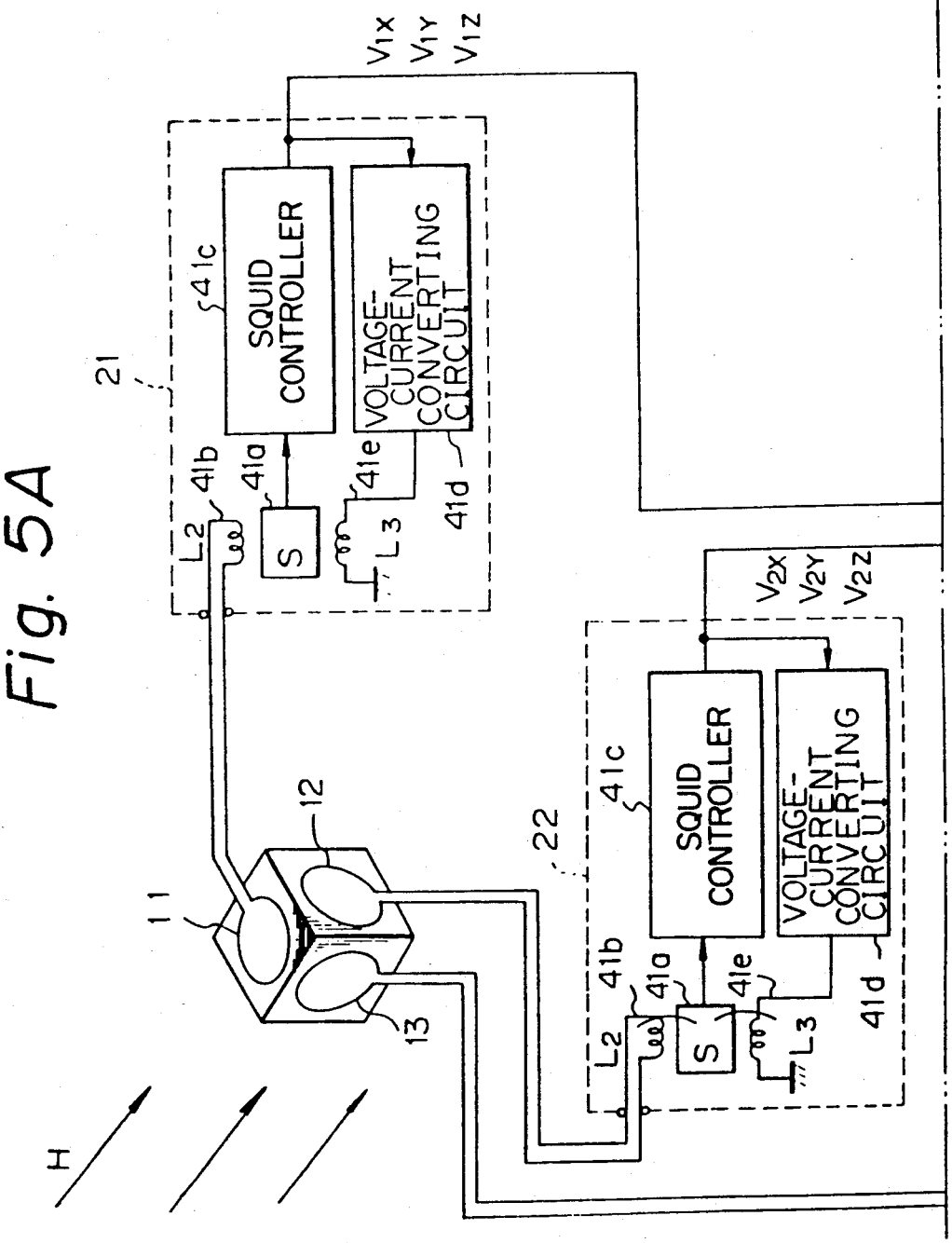

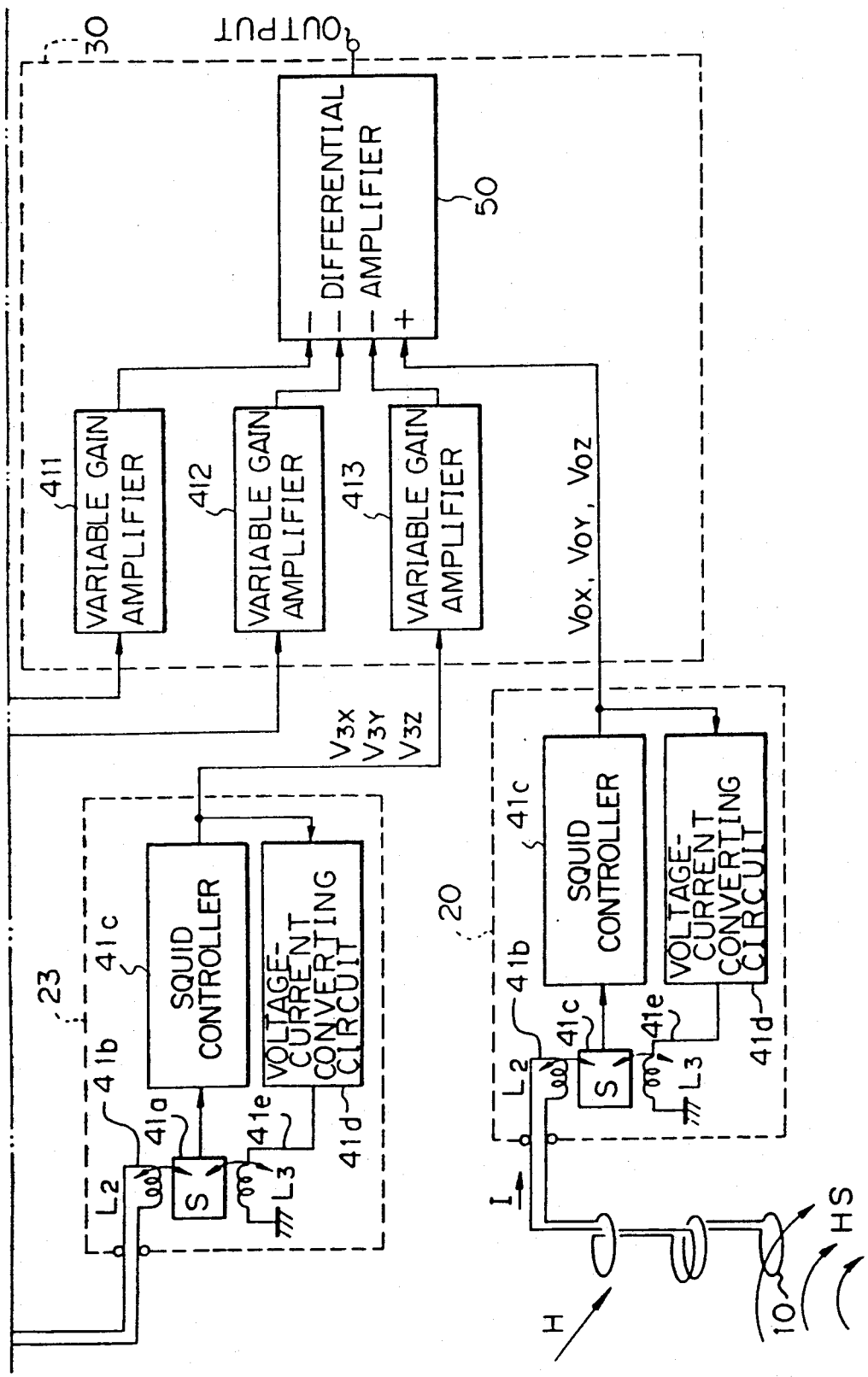

61: SQUID CHIP HOLDER
60
62: PICKUP COIL SUPPORTING MATERIAL
65
66
10
64: COMPENSATION COIL CHIP
63: COMPENSATION COIL SUPPORTING MATERIAL

TO SQUID
10
PICKUP COIL

TO SQUID
11,12,13
COMPENSATION COIL

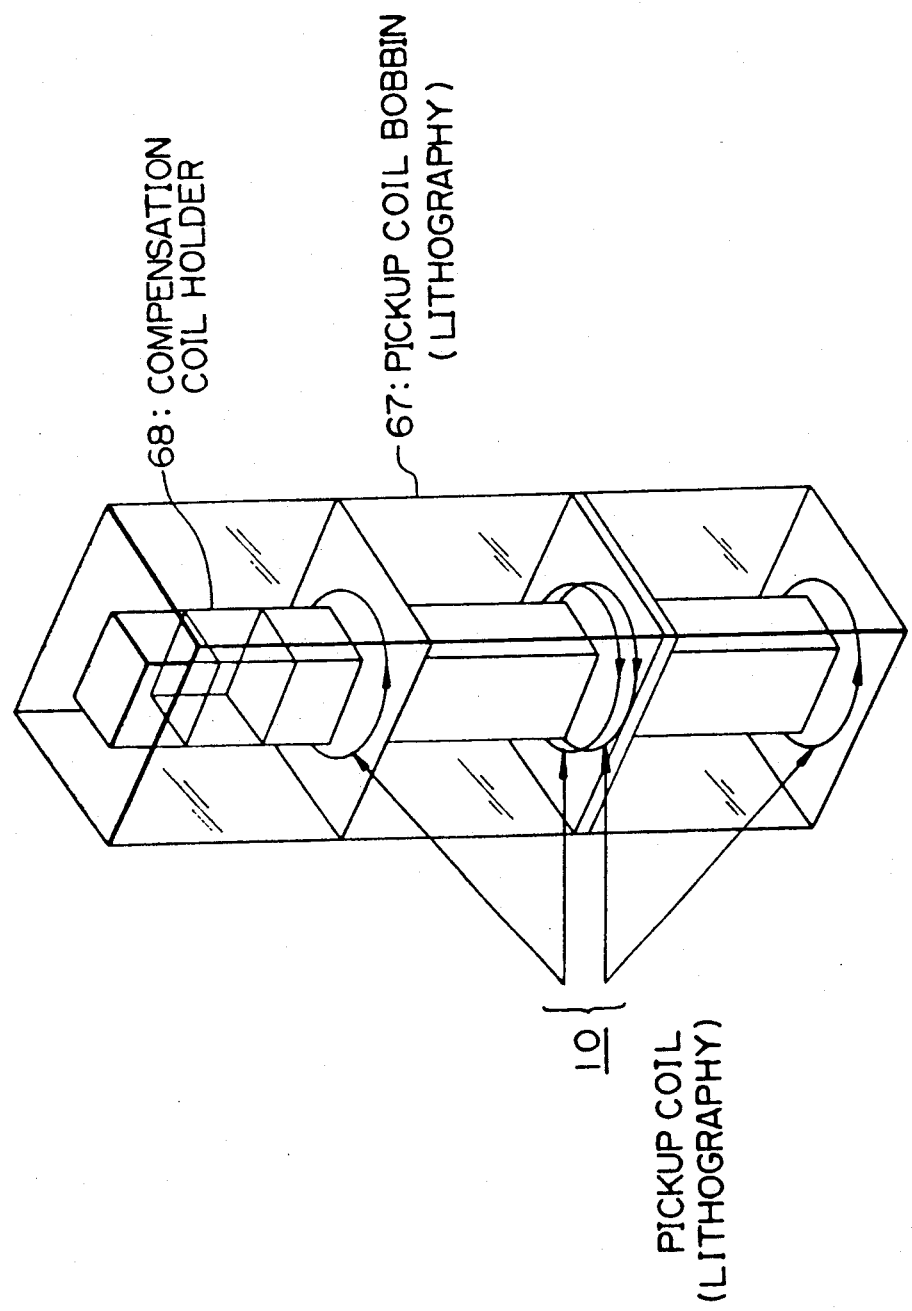

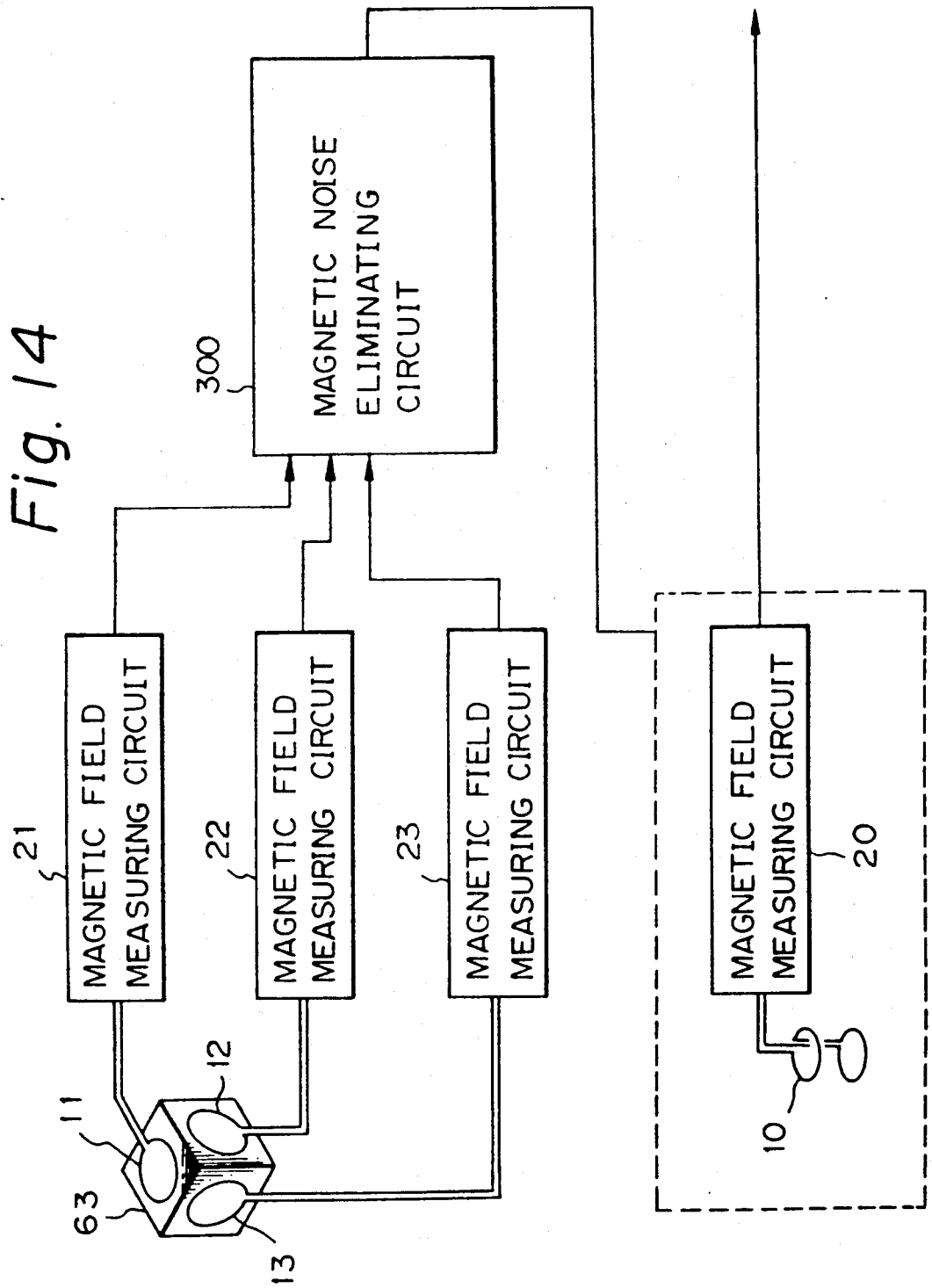

GRADIOMETER APPARATUS WITH COMPENSATION COILS FOR MEASURING MAGNETIC FIELDS

BACKGROUND OF THE INVENTION

1. Field of the Invention

The present invention relates to an apparatus for measuring a magnetic field, and particularly to an apparatus for eliminating, in measuring a very weak magnetic field, external magnetic noise components generated by other magnetic sources and mixed in with the very weak magnetic field to be measured.

2. Description of the Related Art

In recent years, a very weak magnetic field produced by a human body, etc., is measured by a highly sensitive apparatus employing a SQUID (superconducting quantum interference device).

In measuring the very weak magnetic field, external magnetic noise causes a problem. Sources of the external magnetic noise are geomagnetism, electric cars, elevators, electric appliances such as computers, etc. These sources are located very far, compared to a distance between a pickup coil of the measuring apparatus and a source of the very weak magnetic field to be measured. The external magnetic noise may therefore be considered as a uniform magnetic field or uniform gradient field whose direction do not change around the source of the very weak magnetic field.

Based on this assumption, the external magnetic noise can be removed by employing, as the pickup coil, a gradiometer such as a first-order gradiometer and a second-order gradiometer. This type of pickup coil has, however, manufacturing errors which prevent a complete removal of the noise.

SUMMARY OF THE INVENTION

An object of the present invention is to provide an apparatus for measuring a magnetic field, which surely removes noise caused by a uniform magnetic field as well as remaining noise caused by an imbalance in the gradiometer.

According to the present invention, the gradiometer detects the magnetic field of an object to be measured as well as magnetic noise from an external uniform magnetic field. Three compensation coils oriented substantially in different directions detect the magnetic noise in those directions. Magnetic noise components detected by the three compensation coils are weighted and added to each other to find a noise magnetic field existing around the gradiometer. The noise is subtracted from an output of the gradiometer to obtain a correct magnetic field of the object to be measured. In this way, a very weak magnetic field in a human body can be correctly measured.

BRIEF DESCRIPTION OF THE DRAWINGS

The present invention will be more clearly understood from the description as set forth below with reference to the accompanying drawings, wherein:

FIG. 1A is a schematic view showing an apparatus for measuring a magnetic field with the use of a first-order gradiometer according to the prior art;

FIG. 1B is a schematic view showing an apparatus for measuring a magnetic field employing a second-order gradiometer according to the prior art;

FIG. 4 is a block diagram showing an apparatus for measuring a magnetic field according to a first aspect of the present invention;

FIGS. 5, 5A and 5B are circuit diagrams showing the details of the respective parts of the apparatus of FIG. 4;

FIG. 7 is a perspective view showing another arrangement of the second-order gradiometer and compensation coils of the apparatus of FIGS. 4 and 5;

FIG. 14 is a block diagram showing an apparatus for measuring a magnetic field according to a second aspect of the invention;

DESCRIPTION OF THE PREFERRED EMBODIMENTS

Figure 2A:
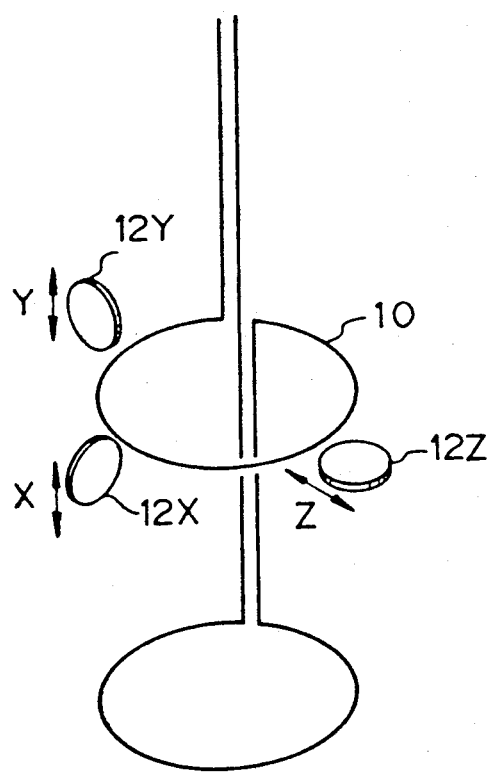
FIG. 2A is a perspective view showing a method of removing noise with the use of a first-order gradiometer and superconducting tabs according to the prior art.

Before describing the preferred embodiments, an explanation will be given of the conventional apparatus for measuring a magnetic field shown in FIGS. 1A to 3.

To remove magnetic noise caused by an external uniform magnetic field, a derivative magnetic field detection coil (hereinafter referred to as the gradiometer) such as a first-order gradiometer 10 shown in FIG. 1A is generally employed. To remove a uniform gradient magnetic field, a second-order gradiometer 100 shown in FIG. 1B is usually employed. In addition to these pickup coils, various types of derivative pickup coils such as third-order gradiometer (not shown) are employed.

The pickup coil 10 and an input coil 41b are made of superconducting material to form a superconducting loop, and the input coil 41b is magnetically connected to a highly sensitive magnetic sensor SQUID (super conducting quantum interference device) 41a. When a magnetic field H is applied to the pickup coil 10, a current I flows through the pickup coil 10 and input coil 41b. The current I is proportional to magnetic flux $\phi_P$ intersecting the pickup coil 10, and the current I is oriented to cancel the magnetic flux $\phi_P$. Magnetic flux $\phi_i$ from the input coil 41b intersects the SQUID 41a and is detected by the SQUID 41a. An output of the SQUID 41a is processed by a SQUID controller 41c, which outputs a signal Vo corresponding to the intersecting magnetic flux. The signal Vo is converted by a voltage-current converting circuit 41d into a current proportional to the signal Vo. The current flows to a feedback coil 41e magnetically connected with the SQUID 41a, such that magnetic flux is fed back to the SQUID 41a to cancel the magnetic flux $\phi_i$ input into the SQUID 41a from the input coil 41b. Using a null method, the magnetic flux $\phi_i$, i.e., the magnetic field H is measured, and an output end of the SQUID controller 41c provides a signal proportional to the magnetic field H.

The portion surrounded by a dotted line in FIGS. 1A and 1B is a magnetic field measuring device 41.

For the sake of simplicity, a first-order gradiometer will be adopted to explain an equivalent coil of the gradiometer coil with respect to a uniform magnetic field.

As shown in FIG. 1A, the first-order gradiometer comprises two component coils. Supposing the areas of the coils and the unit vectors normal to coil planes are $A_1$, $n_1$ and $A_2$, $n_2$, the magnetic flux $\phi$ of a uniform magnetic field H intersecting the gradiometer is expressed as follows:

$$\phi = (A_1 n_1 \cdot H) + (A_2 n_2 \cdot H) \quad (1)$$

where the value between each pair of parenthesis is a scalar product.

The scalar product is obtainable by multiplying a product of absolute values of two vectors by a cosine of an angle formed by the two vectors. This may be represented by a sum of products of three components on respective rectangular coordinate axes of the two vectors.

Conditions to zero the magnetic flux $\phi$ are as follows:

$$A_1 n_1 = -A_2 n_2 \quad (2)$$

Namely, the areas of the two coil planes shall be equal to each other, and the normal directions of the coil planes shall be correctly opposite to each other. The coils involve, however, manufacturing errors, and therefore, the equation (2) is not actually satisfied. Accordingly, the gradiometer provides an output due to the uniform magnetic field.

Supposing $$A_2 = A_1 + \Delta A$$

$$n_2 = -(n_1 + \Delta n),$$

then the intersecting magnetic flux $\phi$ is expressed as follows;

$$\begin{aligned} \phi &= (A_1 n_1 \cdot H) - ((A_1 + \Delta A)(n_1 - \Delta n) \cdot H) \\ &= (-[A_1 \Delta n + \Delta A(n_1 + \Delta n)] \cdot H) \end{aligned} \quad (3)$$

In this equation (3), the bold type part indicates a vector quantity. Supposing the size of the vector is Ae and its normal direction is ne, the equation (3) is expressed as follows:

$$\phi = (A_e n_e \cdot H) \quad (4)$$

This is equal to magnetic flux produced by a coil intersecting the uniform magnetic field and having an area of Ae and a normal direction of $n_e$. Namely, if the two component coils forming the gradiometer do not satisfy the equation (2) with respect to the uniform magnetic field, the gradiometer will be an equivalent of the coil having the area $A_e$ and normal direction $n_e$. In this case, the gradiometer is sensitive to the uniform magnetic field.

For any other gradiometer, it is said that the coil will be an equivalent of a coil having a certain area and a certain direction, if the coil has manufacturing errors.

Generally, a manufactured coil has an area A involving an error ratio of about 0.1% or more. In addition, the parallelism of component coils of the manufactured coil involve errors. Therefore, the coil can reduce external magnetic noise only to about a thousandth.

Figure 2B:
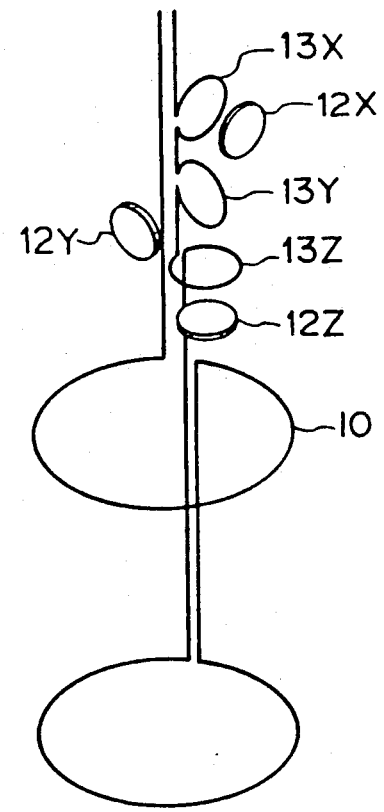
FIG. 2B is a perspective view showing a method of removing noise of a first-order gradiometer by superconducting tabs and compensation loops according to the prior art.

To deal with this problem, FIG. 2A shows a conventional arrangement of three superconducting tabs 12X, 12Y, and 12Z each being a thin plate having a small area (U.S. Pat. No. 3,976,938). The tabs are arranged to change a sensitivity in one of three orthogonal axes of a magnetic field. Positions of the tabs are adjusted in the directions of arrow marks X, Y, and Z shown in FIG. 2A to change a distribution of the magnetic field. Alternatively, as shown in FIG. 2B, three compensation loops 13X, 13Y, and 13Z are arranged orthogonally to each other (U.S. Pat. Nos. 3,956,690, 3,965,411). Superconducting tabs 12X, 12Y, and 12Z are moved to adjust the magnetism blocking quantities of the superconducting tabs with respect to the compensation loops. In both cases, an imbalance of the pickup coil 10 due to manufacturing errors is compensated through the adjustment of the tabs.

The above adjusting operations are, however, quite troublesome because an external uniform AC magnetic field must be applied along each normal of the planes of the superconducting tabs 12X, 12Y, and 12Z and compensation loops 13X, 13Y, and 13Z to minimize an output of the magnetic field measuring device. In addition, the normals of the planes of the three superconducting tabs 12X, 12Y, and 12Z and three compensation loops 13X, 13Y, and 13Z shall correctly be orthogonal to each other. They actually involve, however, manufacturing errors so that, if the device is adjusted in a certain axial direction to provide no output with respect to the uniform magnetic field, an output of the device for another axial direction with respect to the uniform magnetic field may be increased. Repetitive adjusting operations may minimize a noise output due to the uniform magnetic field but it cannot completely cancel the noise.

Figure 3:
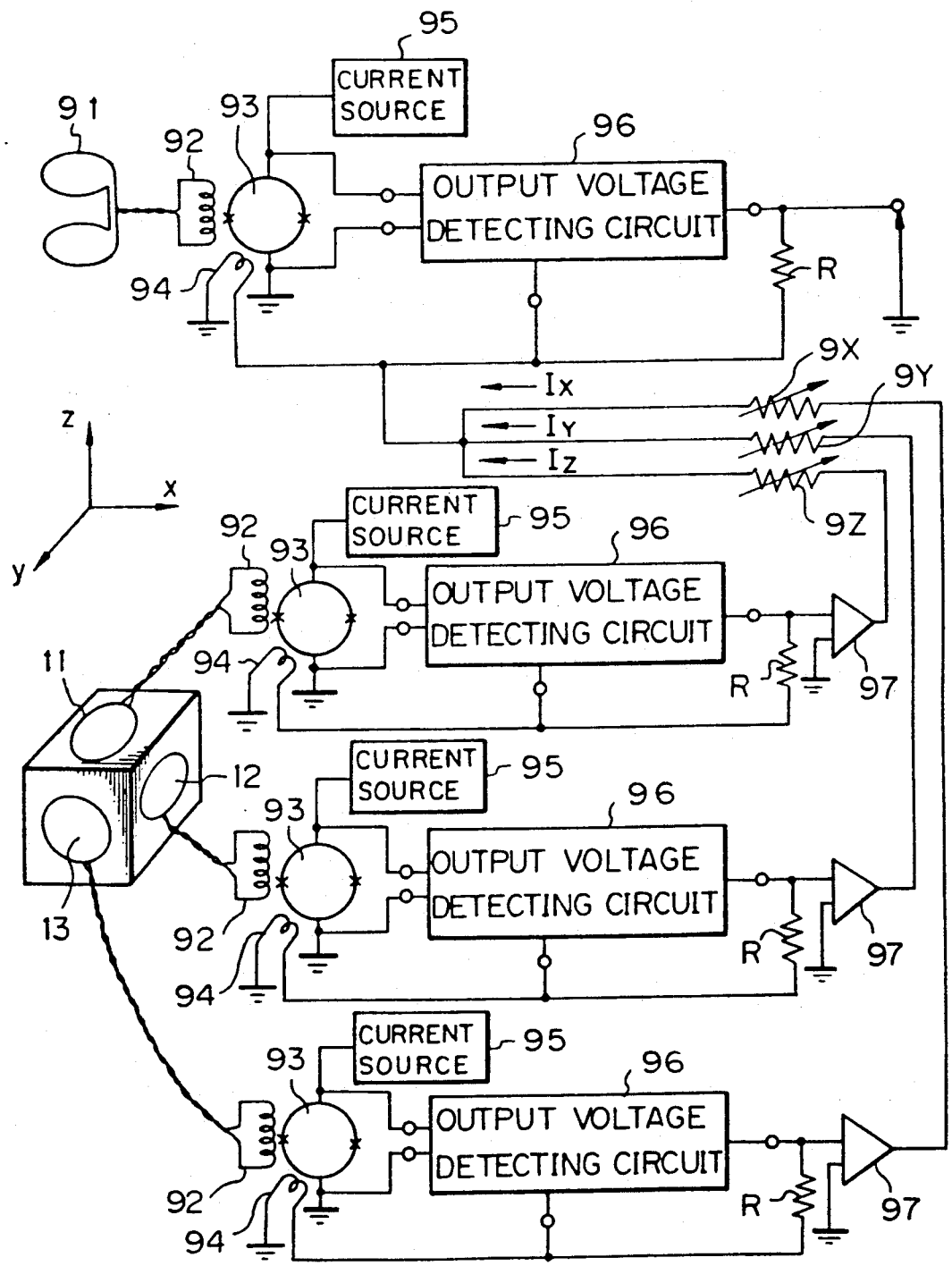
FIG. 3 is a schematic view showing an apparatus for measuring a magnetic field employing three compensation coils according to the prior art.

FIG. 3 shows another conventional technique employing three compensation coils 11, 12, and 13. Normals of the planes of the coils are oriented in directions X, Y, and Z to remove noise caused by a uniform magnetic field. This technique is disclosed in Japanese Unexamined Patent Publication (Kokai) No. 63-32384. In FIG. 3, numeral 91 denotes a coil for detecting a magnetic field, 92 an input coil, 93 a SQUID, 94 a feedback coil, 95 a current source, 96 an output voltage detecting circuit, 97 a variable gain amplifier, and R a feedback resistor.

According to this technique, the magnetic noise is cancelled for each of the directions X, Y, and Z. Therefore, to carry out the adjustment correctly in a short time, the normals of the planes of the three compensation coils must correctly be orthogonal to each other, and the externally applied uniform magnetic field must be exactly aligned with each normal to adjust variable resistors. Since errors tend to occur in the directions of the coil planes as well as in the direction of the uniform magnetic field, even repetitive adjustments cannot completely eliminate the noise caused by the uniform magnetic field.

According to the former technique, a uniform AC magnetic field is externally applied, and the superconducting tabs and compensation loops are successively adjusted to minimize an output of the magnetic field measuring device. This adjustment is troublesome. According to the latter technique, the normals of the planes of the three superconducting tabs and three compensation loops shall correctly be orthogonal to each other. They inevitably involve, however, manufacturing errors that prevent a complete, the noise caused by the uniform magnetic field.

FIG. 4 is a block diagram showing an embodiment according to the first aspect of the present invention. In the figure, numerals 11, 12, and 13 denote compensation coils. The planes of the coils are set such that the magnetic flux of a uniform magnetic field of optional direction intersects at least one of the coils. Numeral 10 denotes a gradiometer. Numerals 21, 22, 23, and 20 denote magnetic field measuring circuits for outputting signals proportional to magnetic flux intersecting the compensation coils 11 to 13 and pickup coil 10, respectively. Numerals 401, 402, and 403 denote multiplication circuits for amplifying the outputs of the magnetic field measuring circuits 21, 22, and 23, respectively. The multiplication circuits 401 to 403 receive weights for changing multiplication factors. Numeral 5 denotes an addition and subtraction circuit for subtracting outputs of the multiplication circuits 401 to 403 from an output of the magnetic (or gradiometric) field measuring circuit 20. The multiplication circuits 401 to 403 and the addition and subtraction circuit 5 form a magnetic noise eliminating circuit 30.

FIGS. 5, 5A and 5B show the details of the apparatus of FIG. 4 of the invention. Each of the magnetic field measuring circuits 21, 22, 23, and 20 comprises an input coil 41$b$, a SQUID 41$a$, a feedback coil 41$e$, a SQUID controller 41$c$ and a voltage-current converting circuit 41$d$. The functions of these elements are the same as those of the conventional circuits shown in FIG. 1A. The multiplication circuits 401 to 403 of the magnetic noise eliminating circuit 30 actually comprise variable gain amplifiers 411 to 413 respectively, and the addition and subtraction circuit 5 actually comprises a differential amplifier 50.

Operation of the apparatus of FIG. 5 will be explained next. A uniform magnetic field (or uniform gradient magnetic field) is successively applied along axes X, Y, and Z. When the uniform magnetic field is applied along the axis X, the magnetic field measuring circuits 21, 22, 23, and 20 provide outputs $V_{1X}$, $V_{2X}$, $V_{3X}$ and $V_{0X}$, respectively. When the uniform magnetic field is applied along the axis Y, the magnetic field measuring circuits 21, 22, 23, and 20 provide outputs $V_{1Y}$, $V_{2Y}$, $V_{3Y}$, and $V_{0Y}$ respectively. When the uniform magnetic field is applied along the axis Z, the magnetic field measuring circuits 21, 22, 23, and 20 provide outputs $V_{1Z}$, $V_{2Z}$, $V_{3Z}$, and $V_{0Z}$, respectively. If the gains of the variable gain amplifiers 411 to 413 are adjusted so that the outputs of the variable gain amplifiers satisfy the following equations (5), the output of the differential amplifier 50 provides a signal from which the noise caused by the uniform magnetic field has been removed:

$$b_1 V_{1X} + b_2 V_{2X} + b_3 V_{3X} = V_{0X} \\ b_1 V_{1Y} + b_2 V_{2Y} + b_3 V_{3Y} = V_{0Y} \\ b_1 V_{1Z} + b_2 V_{2Z} + b_3 V_{3Z} = V_{0Z} \tag{5}$$

where $b_1$, $b_2$, and $b_3$ are the gains of the variable gain amplifiers 411 to 413, respectively. The gains may be positive and negative values.

It is supposed that the magnitude of intersecting magnetic flux derived from the uniform magnetic field becomes maximum when the direction of the uniform magnetic field is normal to the plane of a coil, and that unit vectors normal to the planes of the coils 11 to 13 and 10 are defined as $n_1$, $n_2$, $n_3$, and $n_0$, respectively. When the uniform magnetic field having a vector H is applied in an optional direction, outputs of the variable gain amplifiers 411 to 413 and magnetic field measuring circuit 20 will be $b_1 a_1 (n_1 \cdot H)$, $b_2 a_2 (n_2 \cdot H)$, $b_3 a_3 (n_3 \cdot H)$ and $a_0 (n_0 \cdot H)$, respectively. Here, $a_1$ is a constant determined by an area of the coil 11 and the characteristics of the magnetic field measuring circuit 21; $a_2$ a constant determined by an area of the coil 12 and the characteristics of the magnetic field measuring circuit 22; and $a_3$ a constant determined by an area of the coil 13 and a gain of the magnetic field measuring circuit 23. The constant $a_0$ is determined by an effective area of the gradiometer 10 when the intersecting magnetic flux derived from the uniform magnetic field becomes maximum and by a gain of the magnetic field measuring circuit 20 ($a_0$ will be zero if the gradiometer 10 has no manufacturing error). The value between each pair of parentheses is a scalar product.

Supposing the three orthogonal axis components of the vector H are $H_X$, $H_Y$, and $H_Z$ and axial unit vectors $\mathbf{i}$, $\mathbf{j}$, and $\mathbf{k}$ the above outputs will be expressed as follows:

$$b_1 a_1 (n_1 \cdot H) = b_1 a_1 [(n_1 \cdot \mathbf{i} H_X) + (n_1 \cdot \mathbf{j} H_Y) + (n_1 \cdot \mathbf{k} H_Z)] \\ b_2 a_2 (n_2 \cdot H) = b_2 a_2 [(n_2 \cdot \mathbf{i} H_X) + (n_2 \cdot \mathbf{j} H_Y) + (n_2 \cdot \mathbf{k} H_Z)] \\ b_3 a_3 (n_3 \cdot H) = b_3 a_3 [(n_3 \cdot \mathbf{i} H_X) + (n_3 \cdot \mathbf{j} H_Y) + (n_3 \cdot \mathbf{k} H_Z)] \\ a_0 (n_0 \cdot H) = a_0 [(n_0 \cdot \mathbf{i} H_X) + (n_0 \cdot \mathbf{j} H_Y) + (n_0 \cdot \mathbf{k} H_Z)] \tag{6}$$

To obtain a sum of the outputs of the variable gain amplifiers 411 to 413 equal to an output of the magnetic field measuring circuit 20 irrespective of the direction and magnitude of the uniform magnetic field, the following must be satisfied irrespective of the vector H:

$$b_1 a_1 (n_1 \cdot H) + b_2 a_2 (n_2 \cdot H) + b_3 a_3 (n_3 \cdot H) = a_0 (n_0 \cdot H) \tag{7}$$

This is expressed as follows:

$$(b_1 a_1 n_{1X} + b_2 a_2 n_{2X} + b_3 a_3 n_{3X}) H_X + \qquad (8)$$
$$(b_1 a_1 n_{1Y} + b_2 a_2 n_{2Y} + b_3 a_3 n_{3Y}) H_Y +$$
$$(b_1 a_1 n_{1Z} + b_2 a_2 n_{2Z} + b_3 a_3 n_{3Z}) H_Z =$$
$$a_0 n_{0X} H_X + a_0 n_{0Y} H_Y + a_0 n_{0Z} H_Z$$

To satisfy the equation (8) irrespective of the values $H_X$, $H_Y$, and $H_Z$, coefficients of the values $H_X$, $H_Y$, and $H_Z$ must be equal to each other on both sides. Namely, the following must be satisfied:

$$(b_1 a_1 n_{1X} + b_2 a_2 n_{2X} + b_3 a_3 n_{3X}) H_X = a_0 n_{0X} H_X \qquad (9)$$
$$(b_1 a_1 n_{1Y} + b_2 a_2 n_{2Y} + b_3 a_3 n_{3Y}) H_Y = a_0 n_{0Y} H_Y$$
$$(b_1 a_1 n_{1Z} + b_2 a_2 n_{2Z} + b_3 a_3 n_{3Z}) H_Z = a_0 n_{0Z} H_Z$$

Respective terms of the equations (9) and the above-mentioned actually measured values have the following relations:

$$\begin{aligned} a_1 n_{1X} H_X &= V_{1X}, & a_2 n_{2X} H_X &= V_{2X}, \\ a_3 n_{3X} H_X &= V_{3X}, & a_0 n_{0X} H_X &= V_{0X}, \\ a_1 n_{1Y} H_Y &= V_{1Y}, & a_2 n_{2Y} H_Y &= V_{2Y}, \\ a_3 n_{3Y} H_Y &= V_{3Y}, & a_0 n_{0Y} H_Y &= V_{0Y}, \\ a_1 n_{1Z} H_Z &= V_{1Z}, & a_2 n_{2Z} H_Z &= V_{2Z}, \\ a_3 n_{3Z} H_Z &= V_{3Z}, & a_0 n_{0Z} H_Z &= V_{0Z}. \end{aligned} \qquad (10)$$

Therefore, the equations (9) will be written as follows:

$$\begin{aligned} b_1 V_{1X} + b_2 V_{2X} + b_3 V_{3X} &= V_{0X} \\ b_1 V_{1Y} + b_2 V_{2Y} + b_3 V_{3Y} &= V_{0Y} \\ b_1 V_{1Z} + b_2 V_{2Z} + b_3 V_{3Z} &= V_{0Z} \end{aligned} \qquad (11)$$

From the simultaneous equations (11), three unknown values $b_1$, $b_2$ and $b_3$ are found, and the gains of the variable gain amplifiers 411, 412, and 413 are set to the values $b_1$, $b_2$, and $b_3$, respectively. As a result, with respect to the uniform magnetic field of optional direction, a sum of the outputs of the left sides, i.e., a sum of the outputs of the variable gain amplifiers 411 to 413, may be made equal to an output of the magnetic field measuring circuit 20. As a result, the noise due to the uniform magnetic field is removed from the output of the differential amplifier 50.

The compensation coils 11 to 13 are located farther than the coil 10 from a magnetic source to be measured, so that a magnetic field Hs to be measured reaches the coils 11 to 13 in very small quantity compared to a quantity thereof reaching the coil 10. Therefore, even if the outputs of the magnetic field measuring circuits are substracted from the output of the magnetic (or gradiometric) field measuring circuit 20, an output component of the magnetic field measuring circuit 20 derived from the magnetic field Hs to be measured will remain substantially as it is and will be transferred to the differential amplifier 50.

In the above explanation, for the sake of simplicity, a uniform magnetic field is successively applied along three orthogonal axes to find the values $b_1$, $b_2$, and $b_3$. It is not necessary, however, to apply the uniform magnetic field along the three orthogonal axes. The uniform magnetic field may be applied in three different directions that are not parallel with any plane. It is supposed that magnetic fields $H_1$, $H_2$, and $H_3$ of three directions satisfying the above conditions are successively applied. When the uniform magnetic field $H_1$ is applied, the magnetic field measuring circuits 21 to 23 and 20 provide outputs $V_{1X}$, $V_{2X}$, $V_{3X}$, and $V_{0X}$, respectively. When the uniform magnetic field $H_2$ is applied, the magnetic field measuring circuits 21 to 23 and 20 provide outputs $V_{1Y}$, $V_{2Y}$, $V_{3Y}$, and $V_{0Y}$, respectively. When the uniform magnetic field $H_3$ is applied, the magnetic field measuring circuits 21 to 23 and 20 provide outputs $V_{1Z}$, $V_{2Z}$, $V_{3Z}$, and $V_{0Z}$, respectively. Thereafter, the gains of the variable gain amplifiers are adjusted so that the outputs of the variable gain amplifiers satisfy the equations (11). As a result, the output of the differential amplifier 50 provides a signal from which the noise caused by the uniform magnetic field has been removed.

Figure 6A:
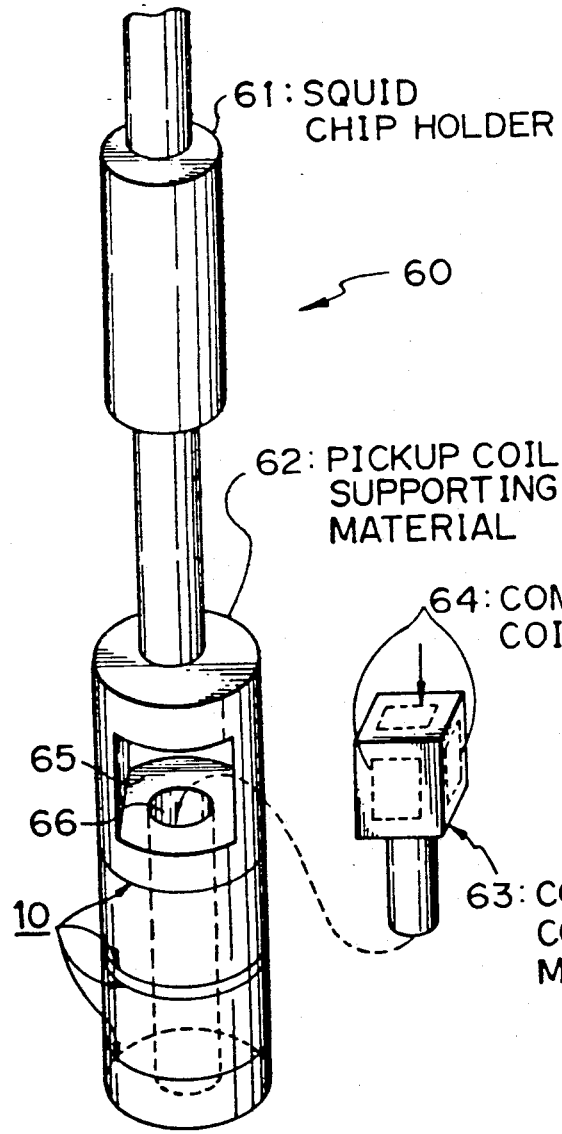
FIG. 6A is a perspective view showing an arrangement of a second-order gradiometer and compensation coils of the apparatus of FIGS. 4 and 5.
Figure 6B:
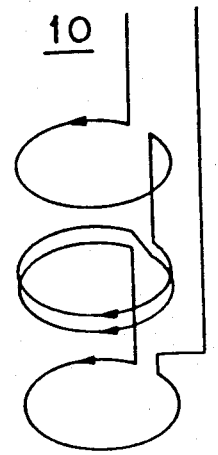
FIG. 6B is a perspective view showing a way of winding the pickup coil of FIG. 6A.
Figure 6C:
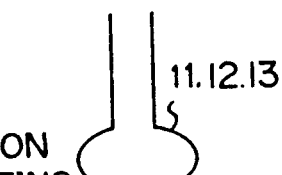
FIG. 6C is a perspective view showing a way of winding each compensation coil of FIG. 6A.

FIG. 6A shows a probe 60 for holding the compensation coils 11 to 13 and pickup coil 10 shown in FIGS. 4 and 5. The probe 60 comprises a SQUID chip holder 61 for accommodating the magnetic field measuring circuits 20 to 23, a pickup coil supporting material 62 for holding the second-order gradiometer 10, and a compensation coil supporting material 63 for supporting the compensation coils 11 to 13. Around the pickup coil supporting material 62, the pickup coil 10 is wound in a manner as shown in FIG. 6B. At the top of the compensation coil supporting material 63, compensation coil chips 64 are disposed on faces X, Y, and Z, respectively. The compensation coil chips 64 hold the compensation coils 11 to 13. Each of the compensation coils 11 to 13 is a single winding coil as shown in FIG. 6C. The compensation coil supporting material 63 is received in an opening 65 formed on the pickup coil supporting material 62. Numeral 66 denotes a hole for receiving a rod that protrudes from the bottom of the compensation coil supporting material 63.

The compensation coil chips 64 supported by the compensation coil supporting material 63 comprise wafers on which the compensation coils 11 to 13 are formed. The compensation coil chips 64 are fixed to the three faces X, Y, and Z of a cube. The compensation coil supporting material 63 with the fixed coil chips 64 is assembled and embedded in an open block 65 of the pickup coil supporting material 62 to make a SQUID sensor, which is resistant to strain from vibration and aging and demonstrates a high S/N ratio. Signals picked up by the pickup coil 10 and compensation coils 11 to 13 are applied to the magnetic field measuring circuits 20 to 23 disposed inside the SQUID chip holder 61 at the upper part of the probe 60. The signals are then converted by the circuits 20 to 23 into signals or pulses proportional to the strength of the magnetic field, and output outside.

FIG. 7 shows another embodiment of the probe 60 for holding the compensation coils 11 to 13 and pickup coil 10. In the figure, numeral 67 denotes a pickup coil bobbin, and 68 a compensation coil holder. This embodiment is characterized in that the pickup coil 10 is formed by lithography etching.

Figure 8:
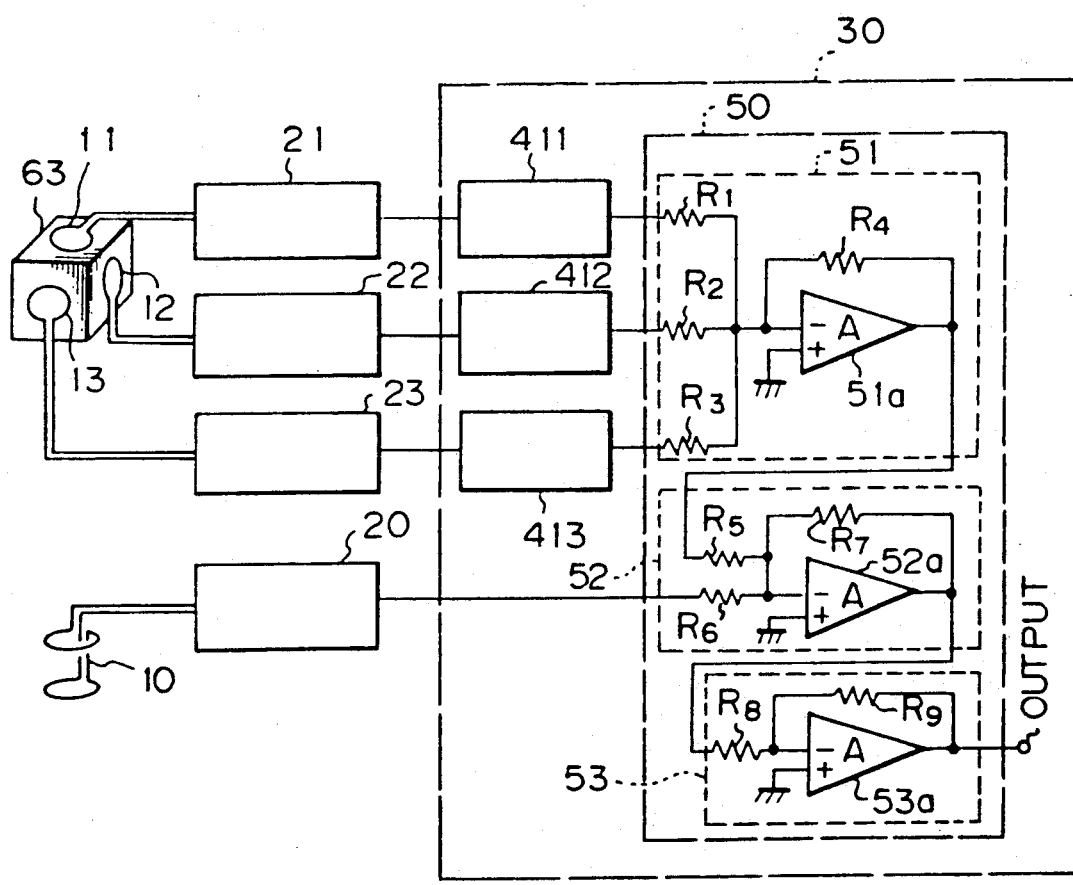
FIG. 8 is a circuit diagram showing the details of a magnetic noise eliminating circuit of FIG. 5.

FIG. 8 shows the details of the differential amplifier 50 of the magnetic noise eliminating circuit 30 of FIG. 5. In FIG. 8, the magnetic field measuring circuits 20 to 23 and variable gain amplifiers 411 to 413 are the same as those shown in FIGS. 5A and 5B, and therefore, their explanation will be omitted. The differential amplifier 50 comprises an addition circuit 51 having resistors $R_1$ to $R_4$ and an operational amplifier 51a; an addition circuit 52 having resistors $R_5$ to $R_7$ and an operational amplifier 52a; and an inverting amplifier 53 having resistors $R_8$ and $R_9$ and an operational amplifier 53a. In the differential amplifier 50, the addition circuit 55 adds outputs of the variable gain amplifiers 411 to 413 to each other, and the addition result is inverted and output to the addition circuit 52. In the addition circuit 52, the inverted addition result is added to the output of the magnetic field measuring circuit 20. Namely, the outputs of the variable gain amplifiers 411 to 413 are substracted from the output of the magnetic field measuring circuit 20. The substracted result is inverted and output to the inverting amplifier 53. The inverting amplifier 53 again inverts the substracted result inverted by the addition circuit 52 to return the same to a normal value. As a result, a signal from which the noise caused by a uniform magnetic field and caused by far external noise sources has been removed is obtainable.

Figure 9:
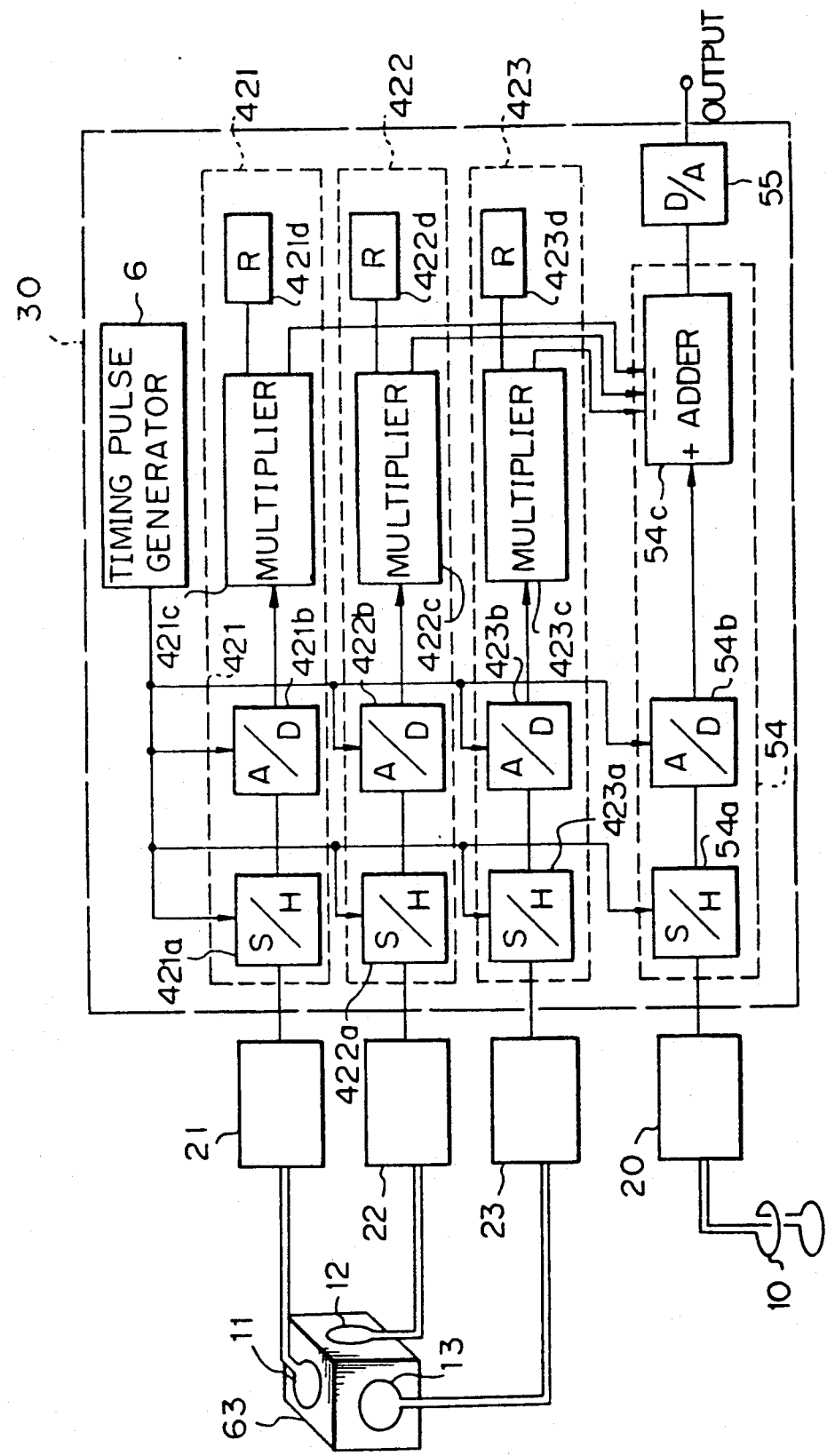
FIG. 9 is a circuit diagram showing a magnetic noise eliminating circuit similar to that of FIG. 5 but realized by a digital circuit.

FIG. 9 shows a digital circuit achieving a function of the magnetic noise eliminating circuit 30 of FIGS. 5A and 5B. In this embodiment, the magnetic noise eliminating circuit 30 comprises multiplication circuits 421, 422, and 423, an addition and substraction circuit 54, and a timing pulse generator 6. The multiplication circuits 421, 422, and 423 comprise sample-hold circuits 421a, 422a, and 423a for helping the normal operation of analog-to-digital converters by sampling and holding analog signal values at an optional time, analog-to-digital converters (hereinafter referred to as A/D converters) 421b, 422b, and 423b, multipliers 421c, 422c, and 423c, and registers 421d, 422d, and 423d.

The addition and substraction circuit 54 comprises a sample-hold circuit 54a, an A/D converter 54b, and an adder 54c.

In this arrangement, outputs of the magnetic field measuring circuits 20 to 23 are sampled at certain intervals based on signals from the timing pulse generator 6. The sampled outputs are converted into digital signals by the A/D converters 421b, 422b, 423b, and 54b, respectively. In the same manner as the previous embodiment, the values $b_1$, $b_2$ and $b_3$ are found.

These values are set in the registers 421d, 422d, and 423d, respectively. When an objective magnetic field is measured, detected values are multiplied by the values $b_1$, $b_2$, and $b_3$ in the A/D converters 421b, 422b, and 423b, respectively, and then the values are substracted from the output of the A/D converter 54b in the adder 54c. As a result, a digital signal from which the noise of the uniform magnetic field has been removed is obtainable. Since an output of the addition and substraction circuit 54 is a digital value, the output is converted into an analog value by the D/A converter 55 and output from the magnetic noise eliminating circuit 30.

Figure 10:
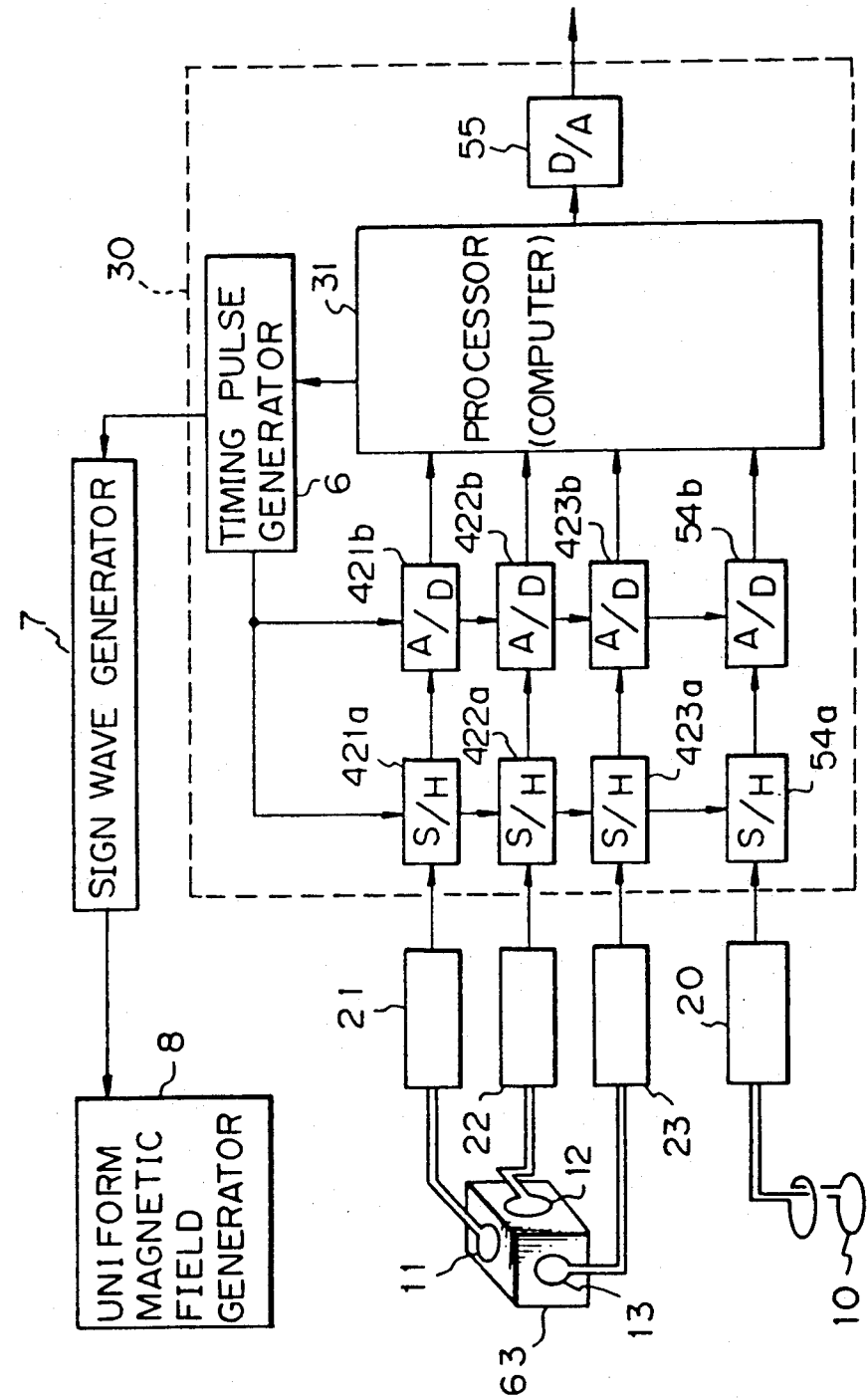
FIG. 10 is a circuit diagram showing a magnetic noise eliminating circuit similar to that of FIG. 5 but realized by a digital circuit and a computer.

FIG. 10 shows another embodiment in which a digital circuit realizes a function of the magnetic noise eliminating circuit 30 of FIG. 5B. The same parts as those shown in FIG. 9 are represented by like reference numerals. The difference between the embodiment of FIG. 10 from that of FIG. 9 will be explained next. The noise removing circuit 30 of FIG. 9 processes signals from the magnetic field measuring circuits 20 to 23 by hardware, while the embodiment of FIG. 10 converts signals from the magnetic field measuring circuits 20 to 23 into digital signals and processes the digital signals by software with the use of a processor (a computer) 31. Similar to the embodiment of FIG. 9, an output of the processor 31 is a digital signal, which is therefore converted into an analog signal and output from the magnetic noise eliminating circuit 30. The embodiment of FIG. 10 employs a uniform magnetic field generator 8 connected to a timing pulse generator 6 through a sine wave generator 7.

Figure 11:
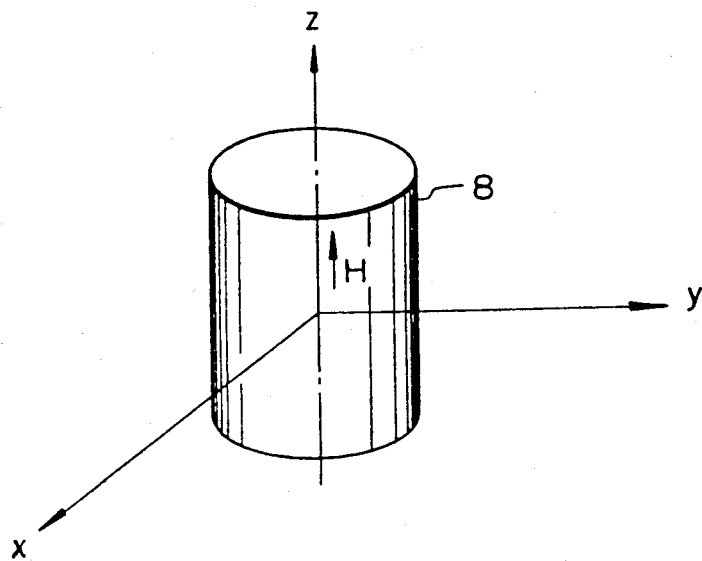
FIG. 11 is a perspective view showing a uniform magnetic field generator of FIG. 10.

FIG. 11 shows an arrangement of the uniform magnetic field generator 8 comprising a cylindrically wound coil. A uniform magnetic field H to be generated is in parallel with an axis of the cylindrical coil. The compensation coils 11 to 13 and pickup coil 10 explained in the previous embodiment are disposed in the center of the cylindrical coil. By changing the axial directions of the respective coils, a uniform AC magnetic field is successively applied along the three orthogonal axes X, Y, and Z, and the maximum values $V_{1X}$, $V_{1Y}$, $V_{1Z}$, $V_{2X}$, $V_{2Y}$, $V_{2Z}$, $V_{3X}$, $V_{3Y}$, $V_{3Z}$, $V_{0X}$, $V_{0Y}$, and $V_{0Z}$ of AC outputs of the magnetic field measuring circuits 20 to 23 are measured in the respective directions. Based on the equation (11), the gain values $b_1$, $b_2$, and $b_3$ are calculated, and the values are set in the variable gain amplifiers 411 to 413, thereby providing a signal from which the noise due to the uniform magnetic field has been removed.

Figure 12:
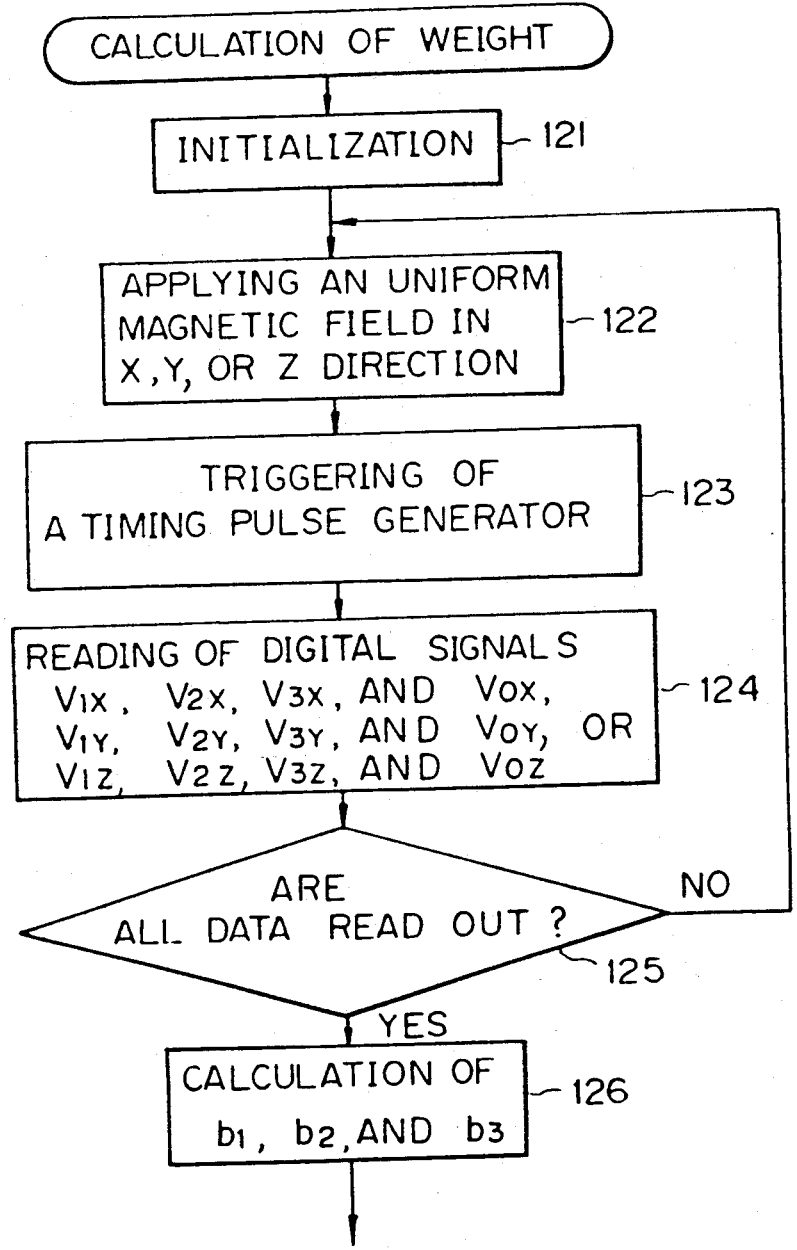
FIGS. 12 and 13 are flowcharts showing control examples of the digital circuit with the computer of FIG. 10.
Figure 13:
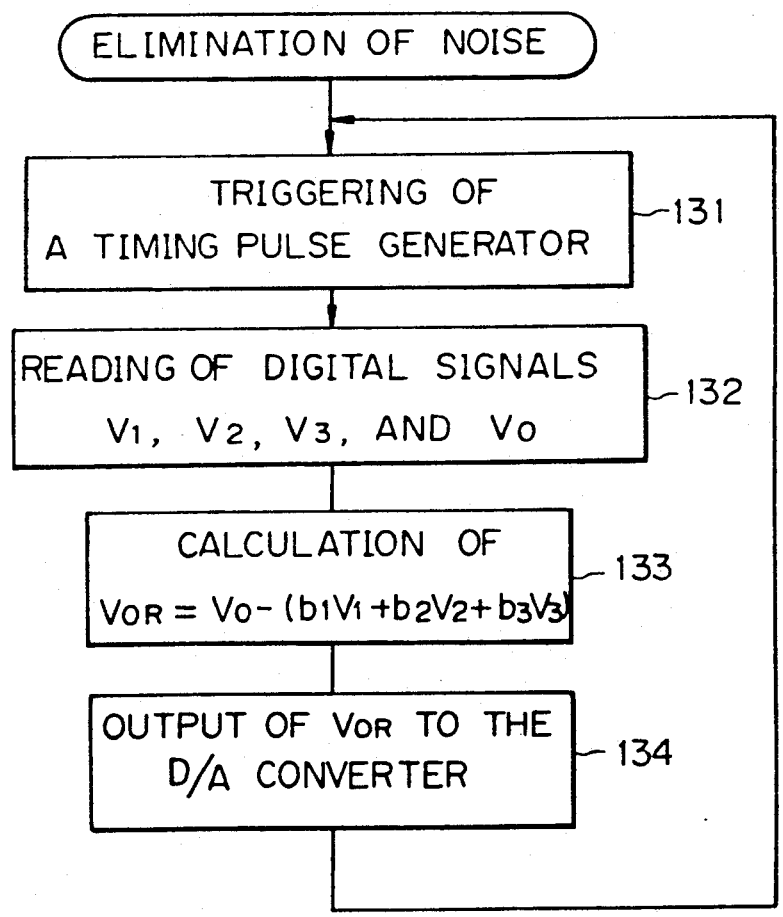

FIGS. 12 and 13 are flowcharts showing the operation of the processor 31 of FIG. 10. FIG. 12 shows weighting operation sequences. In Step 121, an initialization is carried out. In Step 122, the uniform magnetic field generator 8 applies a uniform magnetic field successively in directions X, Y, and Z. In the next Step 123, a trigger signal is applied to the timing pulse generator 6, which then generates a timing pulse. The timing pulse is applied to the sample-hold circuits 421a to 423a and 52a as well as to the A/D converters 421b to 423b and 52b. In Step 124, with the uniform magnetic field in a certain direction, for example in the direction X, digital values converted from the output values $V_{0X}$ to $V_{3X}$ of the magnetic field measuring circuits 20 to 23 are fetched by the processor 31. In Step 125, it is judged whether or not all data for the three directions of the uniform magnetic field have been fetched. If they have not yet been fetched (NO), the Step 122 is repeated. If they have been fetched (YES), Step 126 is carried out. In the Step 126, based on the fetched digital data for the three directions, the equation (11) is evaluated to find the gain values $b_1$, $b_2$, and $b_3$ to be set in the variable gain amplifiers 411 to 413.

FIG. 13 shows the operation sequences of removing magnetic noise. In Step 131, a trigger signal is applied to the timing pulse generator 6, which then generates a timing pulse. The timing pulse is input in to the sample-hold circuits 421a to 423a and 52a as well as the A/D converters 421b to 423b and 52b. In Step 132, digital values converted from output values $V_0$ to $V_3$ of the magnetic field measuring circuits 20 to 23 are fetched by the processor 31. In Step 133, the gain values $b_1$, $b_2$, and $b_3$ that have been derived in the Step 126 to be set in the variable gain amplifiers 411 to 413 are used to derive a weighted sum of the output values $V_1$ to $V_3$ of the magnetic field measuring circuits 21 to 23. The sum is substracted from the output value $V_0$ of the magnetic field measuring circuit 20, i.e., the noise is removed from the output value $V_0$ of the magnetic field measuring circuit 20. Accordingly, a signal with no noise is output to the D/A converter 55 in Step 134. The D/A converter converts the signal into an analog signal, which is output from the magnetic noise eliminating circuit 30.

FIG. 14 shows an embodiment according to the second aspect of the invention. In the embodiments of the first aspect (FIGS. 4, 5A, 5B, 8, 9 and 10), the magnetic noise eliminating circuit 30 substracts a sum of magnetic noise components from a detected value of a magnetic field of an object to be measured. A difference of the embodiment of the second aspect of FIG. 14 is that a magnetic noise eliminating circuit 300 derives a sum of the magnetic noise components and feeds the resultant sum back to a magnetic field measuring circuit for detecting the magnetic field of a measured object. The magnetic field measuring circuit is connected with a gradiometer 10 and another feed back coil magnetically connected with the pickup coil 10. According to the fed back sum, the other coil cancels the noise due to the uniform magnetic field intersecting the gradiometer 10.

Figure 15:
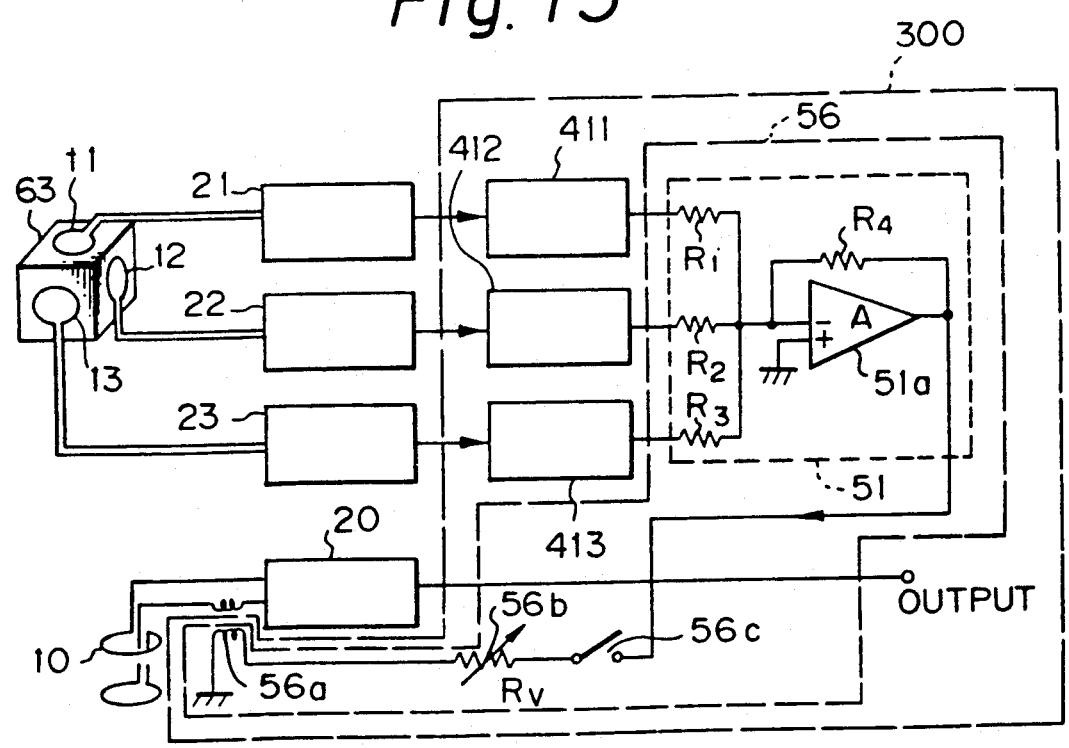
FIG. 15 is a circuit diagram showing the details of a magnetic noise eliminating circuit of FIG. 14.

FIG. 15 shows the details of the magnetic noise eliminating circuit 300 according to the second aspect of the invention. The magnetic noise eliminating circuit 300 comprises variable gain amplifiers 411 to 413 that are the same as those explained before, and an addition and subtraction circuit 56. The addition and subtraction circuit 56 comprises an addition circuit 51 having, similar to that shown in FIG. 8, resistors $R_1$ to $R_4$ and an operational amplifier 51a; a feedback coil 56a magnetically engaging with a superconducting ring having a Josephson junction; a variable resistor 56b acting as current converting means for feeding a current proportional to an output of the addition circuit 51 to the feedback coil 56a; and a switch 56c for preventing a current from flowing from the variable resistor 56b to the feedback coil 56a in finding weight factors.

An adjusting operation of the embodiment will be explained next. Firstly, the switch 56c is disconnected to open a feedback loop, and the values $b_1$, $b_2$ and $b_3$ are calculated in the similar manner as in the previous embodiments. The values $b_1$, $b_2$, and $b_3$ are set as the gains of the variable gain amplifiers 411 to 413, respectively. Thereafter, a uniform magnetic field is applied so that an output of the magnetic field measuring circuit 20 reaches a maximum value. In this state, the switch 56c is connected, and the variable resistor 56b is set to zero the output of the magnetic field measuring circuit 20.

Figure 16:
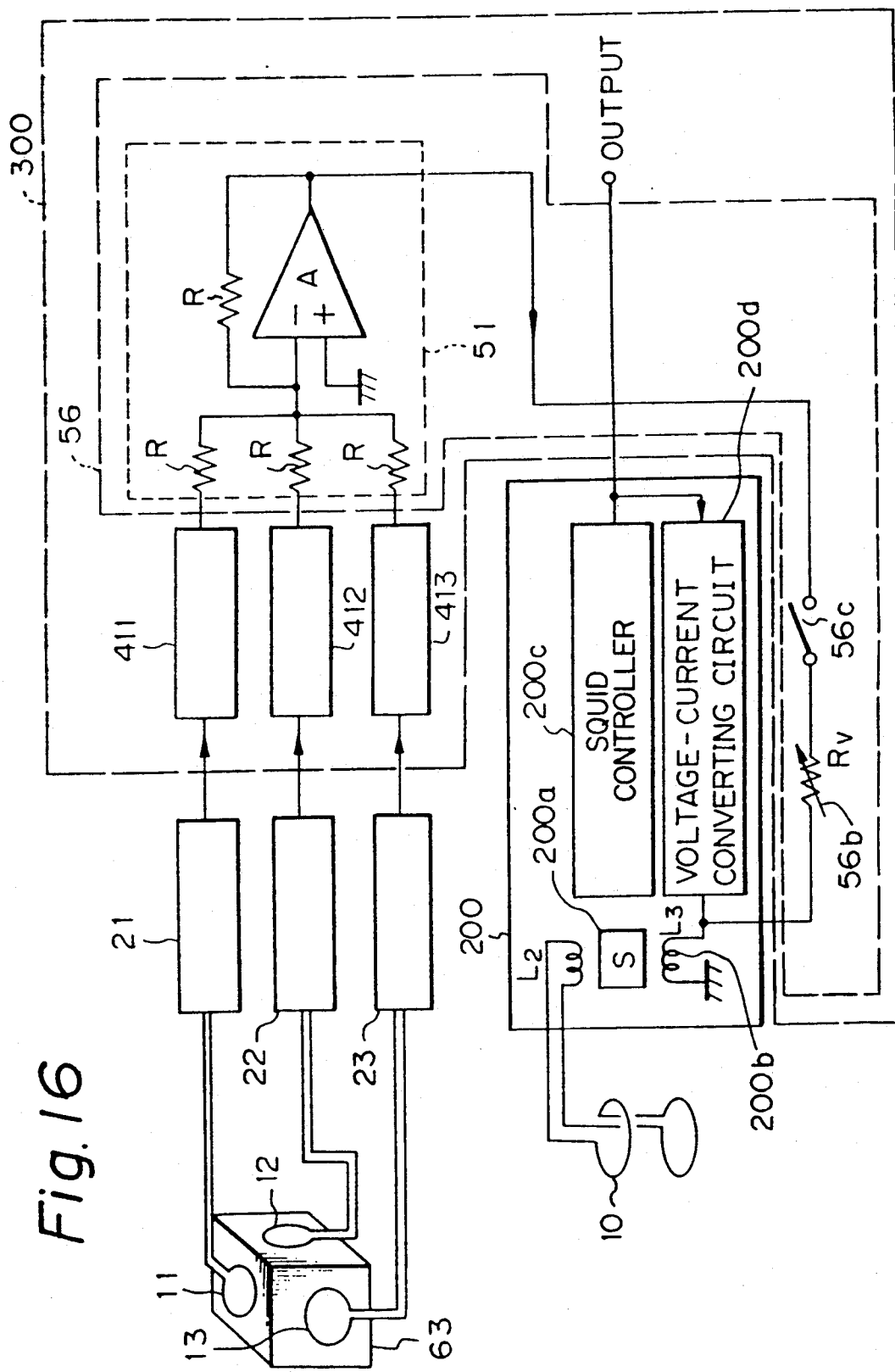
FIG. 16 is a circuit diagram showing a modification of the magnetic noise eliminating circuit of FIG. 14.

FIG. 16 shows a modification of the embodiment of FIG. 15. The arrangement of this embodiment is similar to that of FIG. 15. Therefore, like parts are represented with like numerals to omit the explanations thereof. The difference of the embodiment of FIG. 16 from that of FIG. 15 will be explained next. An output of the addition circuit 51 is fed back to a feedback coil 200b magnetically engaging with a SQUID (a superconducting ring) 200a of a magnetic field measuring circuit 200. The SQUID 200a includes a Josephson element to cancel magnetic flux from a uniform magnetic field intersecting the SQUID 200a. The adjusting operation of this embodiment is the same as that of the embodiment of FIG. 15. Namely, a switch 56c is disconnected to open a feedback loop, and the values $b_1$, $b_2$, and $b_3$ are obtained in a similar manner. The values $b_1$, $b_2$, and $b_3$ are set the gains of variable gain amplifiers 411 to 413, respectively. Thereafter, a uniform magnetic field is applied so that the output of the magnetic field measuring circuit 200 reaches a maximum value. In this state, the switch 56c is connected, and the variable resistor 56b is set to zero the output of the magnetic field measuring circuit 200. Numeral 200c denotes a SQUID controller and 200d a voltage-current converting circuit.

Figure 17:
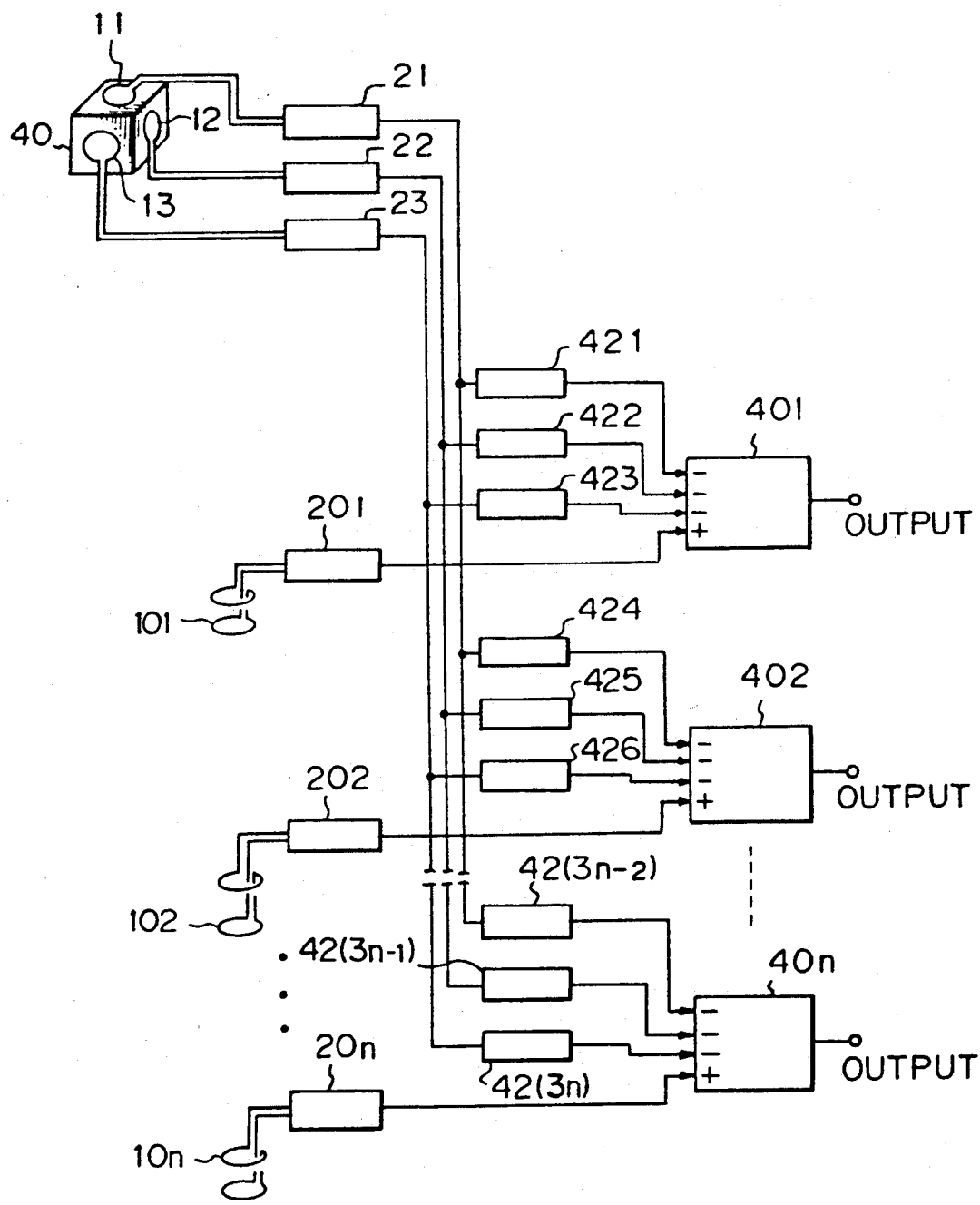
FIG. 17 is a block diagram showing an apparatus for measuring a magnetic field according to the first aspect of the invention, with three gradiometers compensated by one set of compensation coils.

FIG. 17 shows an embodiment of a multichannel magnetic field measuring apparatus employing the magnetic field measuring apparatuses according to the first aspect of the invention, for simultaneously measuring a magnetic field at n locations.

This apparatus comprises a set of compensation coils 11, 12, and 13, magnetic field detectors 21, 22, and 23 for detecting a magnetic field through the compensation coils, gradiometers 101 to 10n disposed for respective channels, magnetic field detectors 201 to 20n for detecting a magnetic field through the pickup coils, first variable gain amplifiers 421, 422, and 423 up to "n"th variable gain amplifiers 42(3n−2), 42(3n−1), and 42(3n) for amplifying outputs of the magnetic field detectors 21, 22, and 23 respectively, and differential amplifiers 401 to 40n for substracting a sum of the outputs of the magnetic field detectors 21, 22, and 23 multiplied by weight factors by the variable gain amplifiers 421 to 42(3n) from the outputs of the magnetic field detectors 201 to 20n, channel by channel. When a uniform magnetic field is applied successively to orthogonal axes X, Y, and Z, the magnetic field detector 22 provides outputs $V_{1X}$, $V_{1Y}$, and $V_{1Z}$ the magnetic field detector 22 provides outputs $V_{2X}$, $V_{2Y}$ and $V_{2Z}$, the magnetic field detector 23 provides outputs $V_{3X}$, $V_{3Y}$, and $V_{3Z}$ and the magnetic field detectors 201 to 20n of the respective channels provides outputs $V_{201X}$, $V_{201Y}$, and $V_{201Z}$ to $V_{20nX}$, $V_{20nY}$, and $V_{20nZ}$. These outputs are measured, and the gains of the variable gain amplifiers of the respective channels are found and set according to the equations (11), thereby eliminating noise components due to the uniform magnetic field from the outputs of the respective channels.

Supposing the values of gains to be set in the "n"th channel of gain amplifiers 42(3n−2), 42(3n−1) and 42(3n) are $b_{1n}$, $b_{2n}$, and $b_{3n}$ respectively, they are found from the following equations (12):

$$b_{1n}V_{1X} + b_{2n}V_{2X} + b_{3n}V_{3X} = V_{20nX} \\ b_{1n}V_{1Y} + b_{2n}V_{2Y} + b_{3n}V_{3Y} = V_{20nY} \\ b_{1n}V_{1Z} + b_{2n}V_{2Z} + b_{3n}V_{3Z} = V_{20nZ} \quad (12)$$

Figure 18:
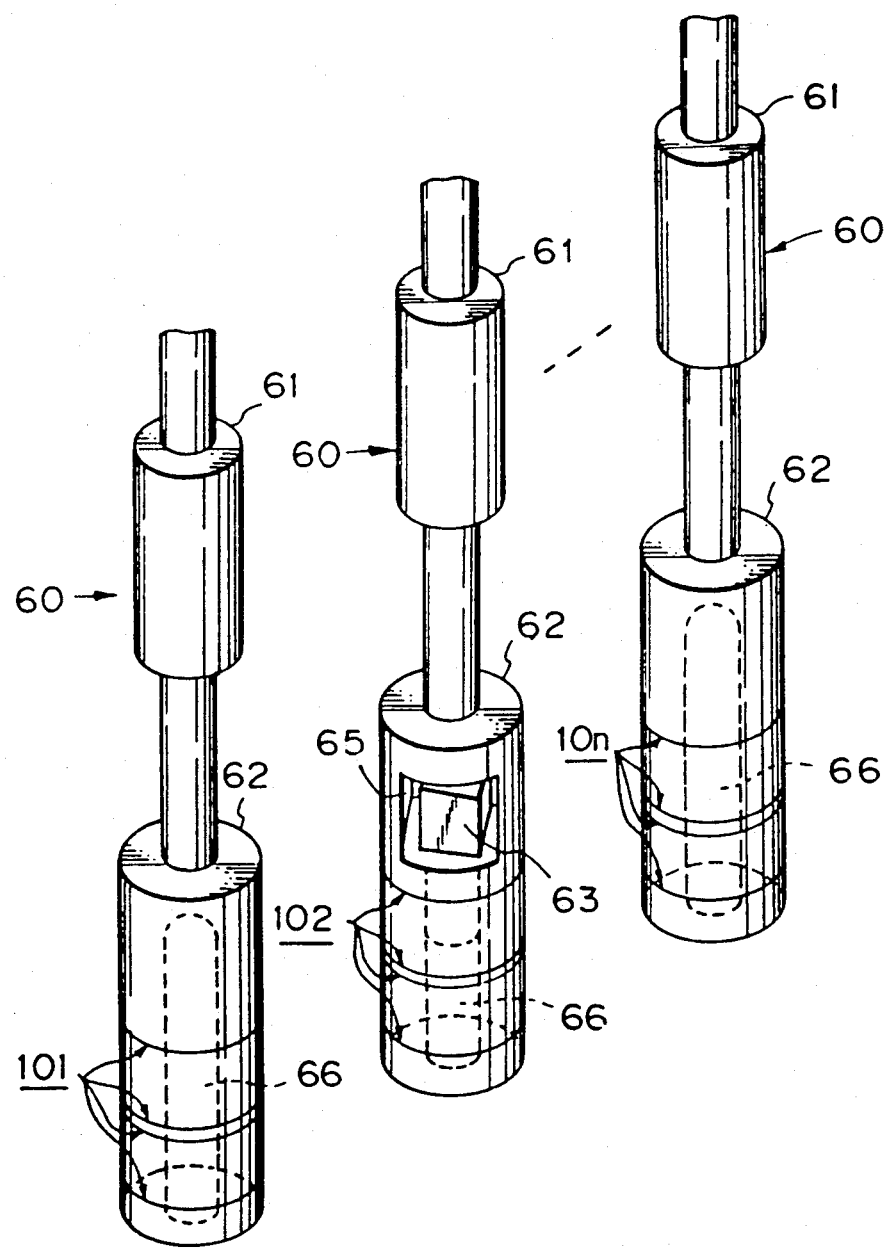
FIG. 18 is a perspective view showing the details of the compensation coils and second-order gradiometers of FIG. 17.

FIG. 18 shows an arrangement of probes 60 in the multichannel magnetic field measuring apparatus of FIG. 17. Since only one compensation coil supporting material 63 is necessary, the material 63 is arranged for the central one of n probes 60. The material 63 is the same as that shown in FIG. 6A. The other probes 60 have only cooling holes 66 formed on pickup coil supporting materials.

Figure 19:
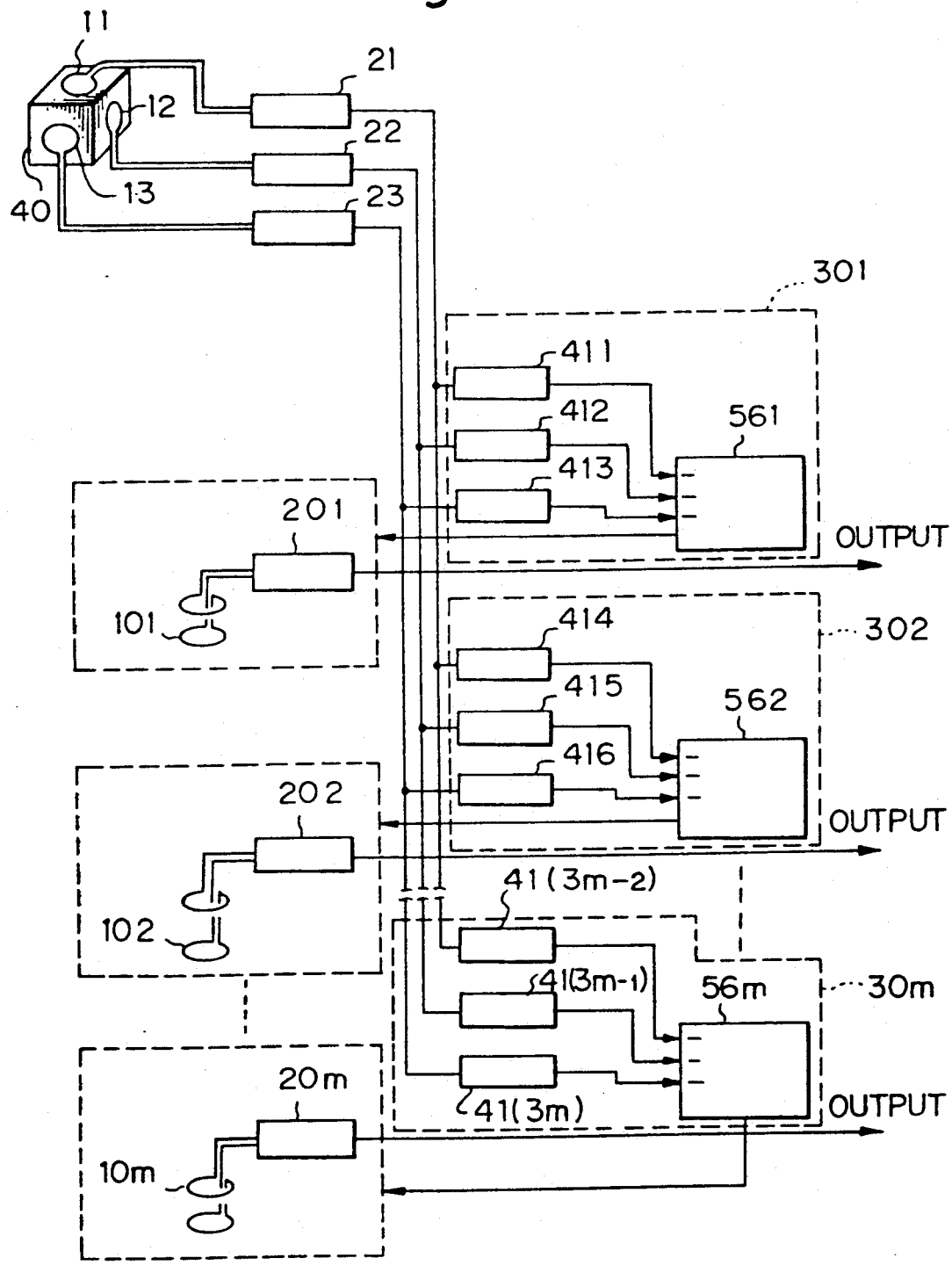
FIG. 19 is a block diagram showing an apparatus for measuring a magnetic field according to the second aspect of the invention, with three gradiometers compensated by one set of compensation coils.

FIG. 19 shows an embodiment for measuring a magnetic field at m locations, employing magnetic field detectors according to the second aspect of the invention. In this embodiment, a set of compensation coils 11, 12, and 13 and a magnetic noise eliminating circuit 301 to 30m operate a sum of magnetic noise components. The resultant sum of the magnetic noise components is fed back to coils magnetically engaging with gradiometers 101 to 10m located at m positions respectively to cancel the magnetic noise of a uniform magnetic field intersecting the gradiometers 101 to 10m.

The magnetic field detectors 20 to 23 of the above embodiments are not necessarily required to be made of superconducting materials.

We claim:

1. An apparatus for measuring a very weak magnetic field such as that generated by a human body, comprising:
   a gradiometer for sensing the magnetic field;
   a gradiometric field measuring circuit, operatively connected to said gradiometer, for outputting a signal indicative of the magnetic field sensed by said gradiometer;

at least three compensation coils for detecting uniform magnetic fields existing around said gradiometer, said three compensation coils being oriented in three different directions that are not in parallel with any one plane;

at least three magnetic field measuring circuits having sensitivity characteristics, operatively connected to said compensation coils, respectively, for outputting signals indicative of the uniform magnetic fields in the three different directions detected by said compensation coils; and a magnetic noise eliminating circuit, operatively connected to said gradiometric and magnetic field measuring circuits, for eliminating magnetic noise in the signal indicative of the magnetic field output from said gradiometric field measuring circuit using scalar products of weight vectors containing weight factors predetermined by the sensitivity characteristics of said magnetic field measuring circuits and measured vectors containing, as vector components, magnetic fields previously measured by said magnetic field measuring circuits and said gradiometric field measuring circuit.

2. An apparatus according to claim 1, wherein said magnetic noise eliminating circuit comprises:

multiplication circuits, operatively connected to said magnetic field measuring circuits, for multiplying the signals output of said magnetic field measuring circuits by predetermined weight factors to weight the outputs; and an addition and subtraction circuit, operatively connected to said multiplication circuits, for finding, from outputs of said multiplication circuits, magnetic noise components caused by the uniform magnetic field existing around said gradiometer, and for subtracting the magnetic noise components from the signal output of said gradiometric field measuring circuit.

3. An apparatus according to claim 2, wherein said magnetic field measuring circuits comprise superconducting quantum interference devices coupled to said compensation coils and operatively connected to said multiplication circuits, wherein said multiplication circuits comprise variable gain amplifiers, operatively connected to said magnetic field measuring circuits, for respectively amplifying the signals output of said magnetic field measuring circuits by the predetermined weight factors, and wherein said addition and subtraction circuit comprises a differential amplifier operatively connected to said multiplication circuits.

4. An apparatus according to claim 3, wherein said gradiometer comprises a pickup coil fitted to a front end of a probe, wherein said apparatus further comprises a support member for supporting said compensation coils substantially coaxially fitted to the probe.

5. An apparatus according to claim 4, wherein said pickup coil is formed on the probe by lithography.

6. An apparatus according to claim 3, wherein said differential amplifier comprises:

a first addition circuit operatively connected to said variable gain amplifiers for adding outputs of said variable gain amplifiers to each other to produce a first sum, inverting the first sum to produce an inverted output, and outputting the inverted output;

a second addition circuit connected to said first addition circuit and said magnetic field measuring circuit for adding the inverted output of said first addition circuit to one of the signals output of said magnetic field measuring circuit to produce a second sum to produce an output and inverting the second sum to produce an output; and an inverting amplifier circuit for inverting the output of said second addition circuit.

7. An apparatus according to claim 1, wherein said magnetic noise eliminating circuit comprises:

sample-hold circuits, operatively connected to said magnetic field measuring circuits and said gradiometric field measuring circuit, for sampling and holding the signals output of said magnetic field measuring circuits and said gradiometric field measuring circuit respectively;

A/D converters, operatively connected to said sample-hold circuits, respectively, for converting analog outputs of said sample-hold circuits into digital signals;

a timing pulse generator, operatively connected to said sample-hold circuits and said A/D converters, for generating operation timing pulses for said sample-hold circuits and said A/D converters;

registers for holding the predetermined weight factors;

multipliers, operatively connected to said A/D converters and said registers, for multiplying the digital signals output by said A/D converters, corresponding to said magnetic field measuring circuits, by the predetermined weight factors held in said registers to produce outputs; and an adder, operatively connected to said multipliers, for adding the outputs of said multipliers to produce an added result and subtracting the added result from output said A/D converter corresponding to said gradiometric field measuring circuit.

8. An apparatus according to claim 1, wherein said magnetic noise eliminating circuit comprises:

sample-hold circuits, operatively connected to said magnetic field measuring circuits and said gradiometric field measuring circuit, respectively, for sampling and holding the signals output of said magnetic field measuring circuits;

A/D converters, operatively connected to said sample-hold circuits, respectively, for converting analog outputs of said sample-hold circuits into digital signals;

a timing pulse generator, operatively connected to said sample-hold circuit and said A/D converters, for generating operation timing pulses for said sample-hold circuits and said A/D converters; and a processor, operatively connected to said A/D converters, for receiving the digital signals output by said A/D converters corresponding to said magnetic field measuring circuits, weighing the digital signals to produce weighted outputs and then adding the weighted outputs to produce an added result, fetching the digital signals output by said A/D converter corresponding to said gradiometric field measuring circuit, and subtracting therefrom the added result.

9. A multiple-point magnetic field measuring apparatus for detecting the distribution of a very weak magnetic field such as that generated by a human body, comprising:

n gradiometers for sensing the magnetic field;

n gradiometric field measuring circuits having sensitivity characteristics, operatively connected to said n gradiometers, respectively, to output signals indicative of the magnetic field sensed by said gradiometers;

at least three compensation coils for measuring uniform magnetic fields existing around said gradiometers, said compensation coils being oriented in different directions, respectively, that are not in parallel with any one plane;

at least three magnetic field measuring circuits having sensitivity characteristics, operatively connected to said compensation coils, respectively, for outputting signals indicative of the uniform magnetic fields in three different directions measured by said compensation coils; and n magnetic noise eliminating circuits, operatively connected to said n gradiometric field measuring circuits, respectively, each magnetic noise eliminating circuit also operatively connected to at least three of said magnetic field measuring circuits, for eliminating magnetic noise in the signals indicative of the magnetic field output from each of said gradiometric field measuring circuits using scalar products of weight vectors containing weight factors predetermined from the sensitivity characteristics of said magnetic field measuring circuits and one of said n gradiometric field measuring circuits and measured vectors containing, as vector components, magnetic fields previously measured by said magnetic field measuring circuits and said n gradiometric field measuring circuits.

10. An apparatus for measuring a very weak magnetic field such as that generated by a human body, comprising:

a gradiometer for sensing the magnetic field;

a gradiometric field measuring circuit having sensitivity characteristics for outputting a signal indicative of the magnetic field sensed by said gradiometer;

at least three compensation coils for detecting uniform magnetic fields existing around said gradiometer, said three compensation coils being oriented in different directions that are not in parallel with any one plane;

at least three magnetic field measuring circuits having sensitivity characteristics, operatively connected to said compensation coils, respectively, for outputting signals indicative of the uniform magnetic fields in three different directions detected by said compensation coils; and a magnetic noise eliminating circuit operatively connected to said magnetic field measuring circuits, and magnetically coupled to aid gradiometer, for eliminating magnetic noise in the signal indicative of the magnetic field by feeding to said gradiometer, the scaler products of weight vectors containing weight factors predetermined from the sensitivity characteristics of said magnetic field measuring circuits and said gradiometric field measuring circuit, and measured vectors containing, as vector components, magnetic fields previously detected by said magnetic field measuring circuits and said gradiometric field measuring circuit.

11. An appartus according to claim 10, wherein said magnetic noise eliminating circuit comprises:

variable gain amplifiers, operatively connected to said magnetic field measuring circuits, for amplifying the signals output of said magnetic field measuring circuits by the weight factors, an addition circuit, operatively connected to said variable gain amplifiers, for adding outputs of said variable gain amplifiers;

a feedback coil magnetically coupled to said gradiometer, for providing the magnetic coupling of the magnetic noise elimating circuit to said gradiometer;

current converting means, operatively connected to said feedback coil and said addition circuit, for feeding a current proportional to an output of said addition circuit to said feedback coil; and current blocking means, operatively connected to said feedback coil and said addition circuit, for preventing a flow of a current from said current converting means to said feedback coil when finding the weight factors.

12. An appartus according to calim 11, wherein said gradiometric field measuring circuit comprises a superconducting quantum inteference device magnetically coupled to said gradiometer, and said feedback coil is magnetically coupled to said superconducting guantum interference device.

13. A multiple-point magnetic field measuring apparatus for measuring the distribution of a very weak magnetic field such as that generated by a human body, comprising:

n gradiometers for sensing the magnetic field;

n gradiometric field measuring circuits, operatively connected to said n gradiometers respectively, for outputting signals indicative of the magnetic field sensed by said gradiometers;

at least three compensation coils for detecting uniform magnetic fields existing around said gradiometers, said compensation coils being oriented in different directions that are not in parallel with any one plane;

at least three magnetic field measuring circuits, operatively connected to said compensation coils, for outputting signals indicative of the uniform magnetic fields in three different directions detected by said compensation coils; and a magnetic noise eliminating circuit, magnetically coupled to at least one of said n gradiometers and operatively connected to said magnetic field measuring circuits, for eliminating magnetic noise in the signal indicative of the magnetic field by feeding back to said at least one of n gradiometers, the scaler products of weight vectors containing weight factors predetermined from measured vectors containing, as vector components, magnetic fields previously measured by said magnetic field measuring circuits and said gradiometric field measuring circuit.

14. A method of compensating a gradiometer for background magnetic noise using a correction circuit, said method comprising the steps of:

(a) applying to the gradiometer and the correction circuit a first essentially uniform magnet field in a first direction;

(b) measuring during said applying in step (a) a first, second and third magnetic field respectively sensed in different directions by the correction circuit and measuring a fourth magnetic field sensed by the gradiometer;

(c) applying to the gradiometer and the correction circuit a second essentially uniform magnetic field in a second direction different than the first direction;

(d) measuring during said applying in step (c) a fifth, sixth and seventh magnetic field respectively sensed in different directions by the correction circuit and measuring an eighth magnetic field sensed by the gradiometer;

(e) applying to the gradiometer and the correction circuit a third essentially uniform magnetic field in a third direction different than the first and second directions, (f) measuring during said applying in step (e) ninth, tenth and eleventh magnetic fields respectively sensed in different directions by the correction circuit and measuring a twelfth magnetic field sensed by the gradiometer;

(g) determining first, second and third weighing factors based on the first through twelfth magnetic fields; and (h) setting the correction circuit for correction by the first, second and third weighing factors.

15. A method according to claim 14, wherein said setting in step (h) sets first, second and third multipliers of the correction circuit for respective multiplication by the first, second and third weighting factors.

16. A method according to claim 15, wherein the correction circuit is additionally provided with a means for subtracting outputs from the first, second and third multipliers from a signal indicative of a magnetic field sensed by the gradiometer.

17. A method of compensating a gradiometer for background magnetic noise using first, second and third magnetic field measuring circuits, said method comprising the steps of:

(a) measuring a first, second and third magnetic field in different directions using the first, second and third magnetic field measuirng circuits to produce first, second and third signals, respectively;

(b) measuring a fourth magnetic field sensed by the gradiometer when measuring in said step (a) to produce a fourth signal;

(c) adjusting the first, second and third signals using scalar products of weight vectors containing weight factors predetermined by the sensitivity characteristics of said magnetic field measuring circuits and measured vectors containing, as vector components, magnetic fields previously measured by said magnetic field measuring circuits and said gradiometer to produce weighted first, second and third signals; and (d) subtracting the weighted first, second and third signals from the fourth signal to eliminate the background noise and produce a compensated gradiometer output signal.

* * * * *

UNITED STATES PATENT AND TRADEMARK OFFICE
CERTIFICATE OF CORRECTION

PATENT NO. : 5,113,136

DATED : May 12, 1992

INVENTOR(S) : Hayashi et al.

It is certified that error appears in the above-identified patent and that said Letters Patent is hereby corrected as shown below:

Col. 4, line 6, "$\Delta A[{}_1 + \Delta_n] \cdot H)$" should be --$\Delta A[n_1 - \Delta_n] \cdot H)$--.

Col. 6, line 66, "$(U_2 \cdot H)$" should be --$(n_2 \cdot H)$--.

Col. 15, line 58, "aid" should be --said--.

Col. 16, line 24, "calim" should be --claim--.

Signed and Sealed this

Fourteenth Day of September, 1993

Attest:

BRUCE LEHMAN

Attesting Officer        Commissioner of Patents and Trademarks